United States Patent
Choi et al.

(10) Patent No.: US 12,381,146 B2
(45) Date of Patent: Aug. 5, 2025

(54) SEMICONDUCTOR DEVICES

(71) Applicant: Samsung Electronics Co., Ltd., Suwon-si (KR)

(72) Inventors: Junyoung Choi, Seoul (KR); Youngwoo Kim, Seoul (KR); Taehoon Kim, Seoul (KR); Sangyeon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 580 days.

(21) Appl. No.: 17/713,705

(22) Filed: Apr. 5, 2022

(65) Prior Publication Data
US 2022/0406713 A1 Dec. 22, 2022

(30) Foreign Application Priority Data
Jun. 17, 2021 (KR) .................. 10-2021-0078666

(51) Int. Cl.
| | | |
|---|---|---|
| *H01L 23/528* | (2006.01) | |
| *H01L 23/522* | (2006.01) | |
| *H01L 23/532* | (2006.01) | |
| *H10B 12/00* | (2023.01) | |

(52) U.S. Cl.
CPC .... *H01L 23/5283* (2013.01); *H01L 23/53295* (2013.01); *H10B 12/315* (2023.02); *H10B 12/50* (2023.02); *H01L 23/5226* (2013.01); *H10B 12/0335* (2023.02)

(58) Field of Classification Search
CPC ................................. H10B 12/05; H10B 12/50
See application file for complete search history.

(56) References Cited

U.S. PATENT DOCUMENTS

| | | | |
|---|---|---|---|
| D454,999 S | 3/2002 | Villafana | |
| 8,455,343 B2 | 6/2013 | Jang | |
| 10,943,812 B2 | 3/2021 | Jang et al. | |
| 2013/0256793 A1* | 10/2013 | Kim ..................... | H10D 84/014 257/334 |

(Continued)

FOREIGN PATENT DOCUMENTS

| | | |
|---|---|---|
| JP | 2015-0070129 A | 4/2015 |
| JP | 2015-0103548 A | 6/2015 |

(Continued)

OTHER PUBLICATIONS

Office Action dated Mar. 6, 2023 issued in related Taiwanese Patent Application No. 111113601.

*Primary Examiner* — Edward Chin
(74) *Attorney, Agent, or Firm* — Harness, Dickey & Pierce, P.L.C.

(57) ABSTRACT

A semiconductor device includes a substrate including a cell region and a peripheral circuit region; a conductive structure on the cell region and the peripheral circuit region, the conductive structure extending in a first direction parallel to an upper surface of the substrate; a gate structure on the peripheral circuit region, the gate structure spaced apart from the conductive structure in the first direction; a spacer contacting a sidewall of the gate structure; and a first capping pattern contacting a sidewall of an end portion in the first direction of the conductive structure and a sidewall of the spacer, wherein the spacer and the first capping pattern include different insulating materials.

20 Claims, 39 Drawing Sheets

(56) References Cited

U.S. PATENT DOCUMENTS

| | | | |
|---|---|---|---|
| 2015/0111360 A1 | 4/2015 | Kim et al. | |
| 2015/0255466 A1* | 9/2015 | Hwang | H10B 12/50 |
| | | | 438/586 |
| 2019/0363088 A1 | 11/2019 | Ryu et al. | |
| 2020/0227269 A1* | 7/2020 | Liu | H10B 12/488 |
| 2020/0411426 A1* | 12/2020 | Lajoie | H10B 12/05 |
| 2021/0175236 A1* | 6/2021 | Shih | H10B 12/488 |
| 2022/0139920 A1* | 5/2022 | Lee | H10B 12/033 |
| | | | 438/241 |

FOREIGN PATENT DOCUMENTS

| | | |
|---|---|---|
| KR | 10-2000136 B1 | 7/2019 |
| TW | 202220171 A | 5/2022 |

\* cited by examiner

FIG. 1
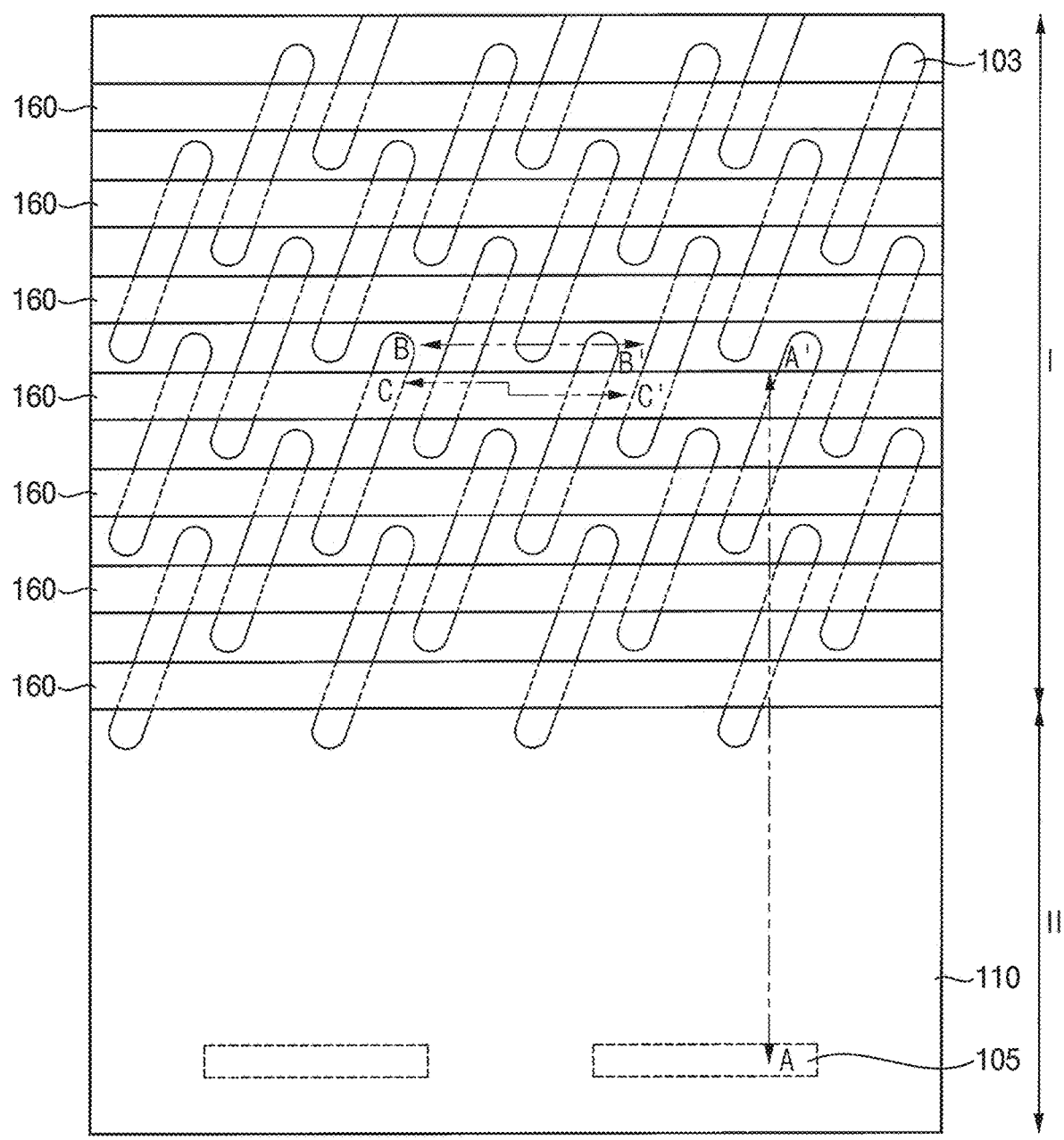
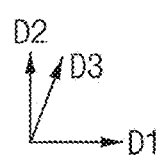

FIG. 3
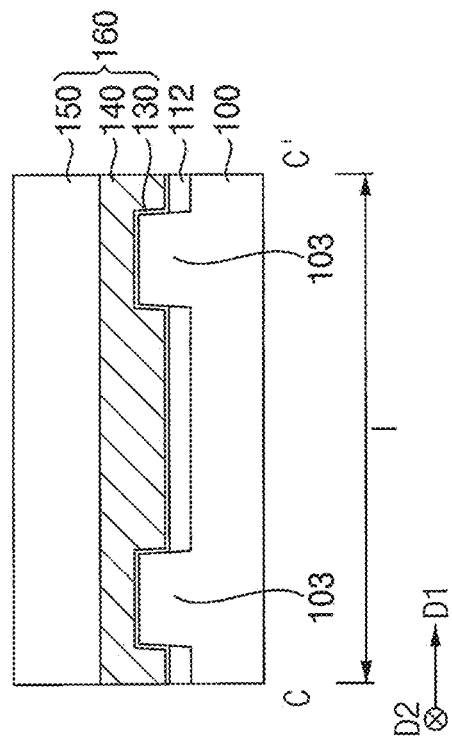
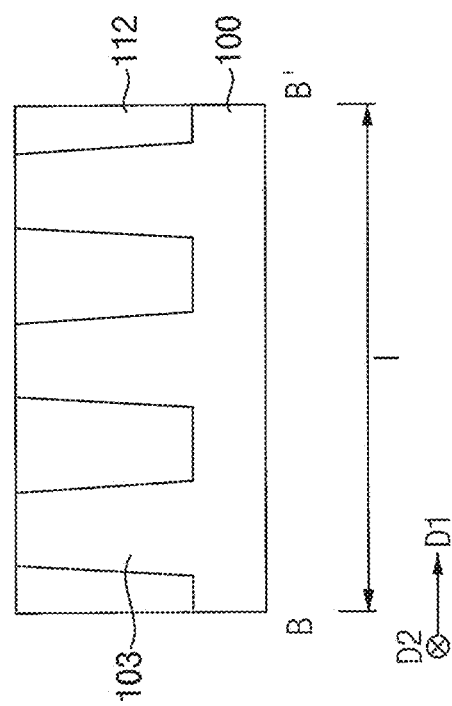

FIG. 29
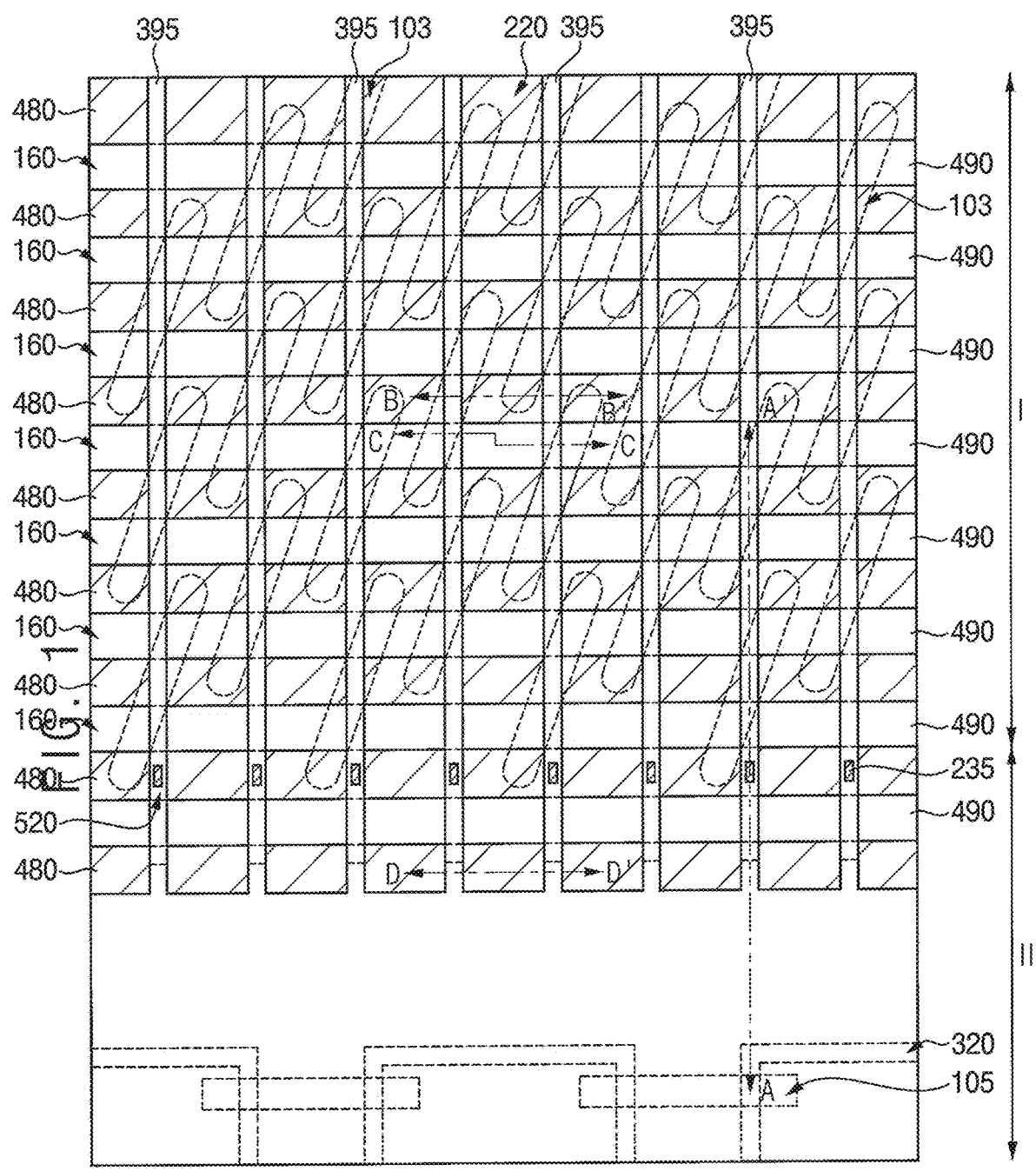
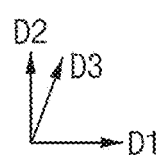

FIG. 33
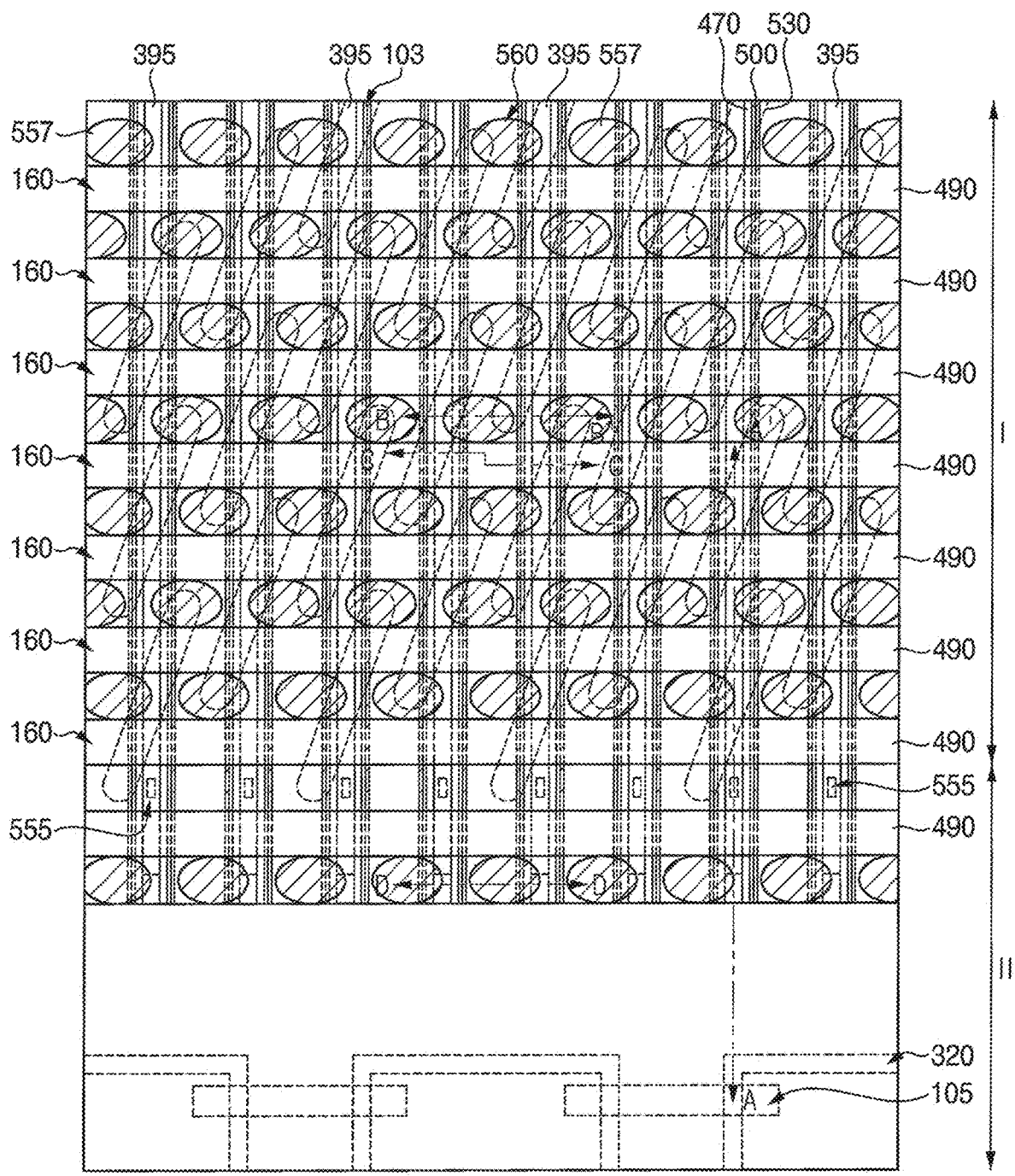
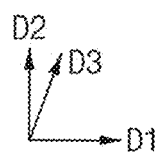

SEMICONDUCTOR DEVICES

CROSS-REFERENCE TO RELATED APPLICATION

This application claims priority under 35 U.S.C. § 119 to Korean Patent Application No. 10-2021-0078666 filed on Jun. 17, 2021 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a DRAM device including a bit line structure.

DISCUSSION OF RELATED ART

In a dynamic random access memory (DRAM) device, contact plug structures may be formed adjacent to bit line structures, and a degree of integration of the DRAM device may be improved. Accordingly, a sufficient separation distance between the contact plug structures may not be secured, and thus an electric short may occur therebetween.

SUMMARY

Example embodiments provide a semiconductor device having improved characteristics.

According to at least some example embodiments of the inventive concepts, a semiconductor device includes a substrate including a cell region and a peripheral circuit region; a conductive structure on the cell region and the peripheral circuit region, the conductive structure extending in a first direction parallel to an upper surface of the substrate; a gate structure on the peripheral circuit region, the gate structure spaced apart from the conductive structure in the first direction; a spacer contacting a sidewall of the gate structure; and a first capping pattern contacting a sidewall of an end portion in the first direction of the conductive structure and a sidewall of the spacer, wherein the spacer and the first capping pattern include different insulating materials.

According to at least some example embodiments of the inventive concepts, a semiconductor device includes a substrate including a cell region and a peripheral circuit region; a conductive structure on the cell region and the peripheral circuit region, the conductive structure extending in a first direction parallel to an upper surface of the substrate; a gate structure on the peripheral circuit region, the gate structure spaced apart from the conductive structure in the first direction; a spacer contacting a sidewall of the gate structure; and a first capping pattern contacting a sidewall of an end portion in the first direction of the conductive structure and a sidewall of the spacer, wherein an upper surface of the spacer is concave.

According to at least some example embodiments of the inventive concepts, a semiconductor device includes a substrate including a cell region and a peripheral circuit region; a first active pattern on the cell region of the substrate; a second active pattern on the peripheral circuit region of the substrate; an isolation pattern structure on the substrate, the isolation pattern structure between the first and second active patterns, a first gate structure in an upper portion of the first active pattern, the first gate structure extending in a first direction parallel to an upper surface of the substrate; a second gate structure on the second active pattern and a portion of the isolation pattern structure, the second gate structure including a first conductive pattern, a first barrier pattern, a second conductive pattern and a first capping pattern sequentially stacked in a vertical direction perpendicular to the upper surface of the substrate; a spacer contacting a sidewall of the second gate structure; a conductive structure on the first active pattern and a portion of the isolation pattern structure, the conductive structure extending in a second direction, the second direction being a direction that is parallel to the upper surface of the substrate and crosses the first direction, the conductive structure including a third conductive pattern, a second barrier pattern, a fourth conductive pattern and a second capping pattern sequentially stacked in the vertical direction; an etch stop pattern on an upper surface of the conductive structure, an upper surface of the second gate structure and an upper surface of the spacer; a third capping pattern on the etch stop pattern, the third capping pattern contacting a sidewall of an end portion, in the second direction, of the conductive structure and a sidewall of the spacer; a contact plug structure on the first active pattern and adjacent to the conductive structure; and a capacitor on the contact plug structure, wherein the spacer and the third capping pattern include different insulating materials.

In the semiconductor device, the electrical short between the contact plug structures may be prevented, and thus the semiconductor device may have improved electrical characteristics.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIGS. 1 to 39 are plan views and cross-sectional views illustrating a method of manufacturing a semiconductor device according to example embodiments.

DETAILED DESCRIPTION

Figure 2:
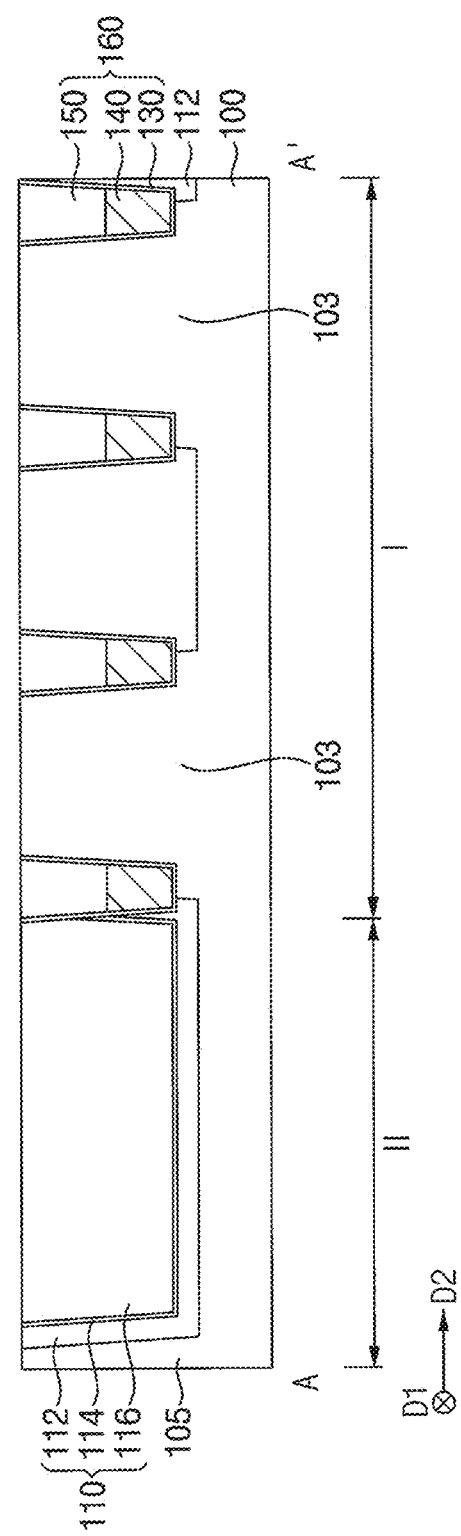

As is traditional in the field of at least some example embodiments of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of at least some example embodiments of the inventive concepts. Further, the blocks, units and/or modules of the embodiments may be physically combined into more complex blocks, units and/or modules without departing from the scope of at least some example embodiments of the inventive concepts.

FIGS. 1 to 39 are plan views and cross-sectional views illustrating a method of manufacturing a semiconductor device according to example embodiments. Specifically, FIGS. 1, 4, 9, 15, 19, 25, 29 and 33 are the plan views, FIGS. 2, 5, 7, 10-11, 13, 16, 17, 20, 30-31, 34 and 37 are cross-sectional views taken along lines A-A' of corresponding plan views, respectively, each of FIGS. 3, 6, 8, 12, 14, 18, 21, 23, 24, 26, 28, 32, 35 and 38 includes cross-sections taken along lines B-B' and C-C' of a corresponding plan view, and each of FIGS. 22, 27, 36 and 39 includes cross-sections taken along lines D-D' of a corresponding plan view.

Hereinafter, in the specification (but not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3.

Referring to FIGS. 1 to 3, first and second active patterns 103 and 105 may be formed on the substrate 100 include first and second regions I and II, and an isolation pattern structure 110 may be formed to cover sidewalls of the first and second active patterns 103 and 105.

The substrate 100 may include, for example, silicon, germanium, silicon-germanium, or a III-V group compound semiconductor, such as GaP, GaAs, or GaSb. According to at least some example embodiments of the inventive concepts, the substrate 100 may be a silicon-on-insulator (SOI) substrate or a germanium-on-insulator (GOI) substrate.

The first region I of the substrate 100 may be a cell region in which memory cells may be formed. The second region II of the substrate 100 may surround the first region I of the substrate 100, and may be a peripheral circuit region in which peripheral circuit patterns for driving the memory cells may be formed.

The first and second active patterns 103 and 105 may be formed by removing an upper portion of the substrate 100 to form a first recess, and a plurality of first active patterns 103 each of which may extend in the third direction D3 may be spaced apart from each other in one or both of the first and second directions D1 and D2. Additionally, a plurality of second active patterns 105 may be spaced apart from each other in one or both of the first and second directions D1 and D2. In the drawing (e.g., FIG. 1), neighboring two of the second active patterns 105 arranged to extend in the first direction D1 are shown.

According to at least some example embodiments of the inventive concepts, the isolation pattern structure 110 may include first, second and third division patterns 112, 114 and 116 sequentially stacked from an inner wall of the first recess. Ones of the first recesses that are formed on the first region I of the substrate 100 may have a relatively small width, and thus only the first division pattern 112 may be formed therein. However, ones of the first recesses that are formed on the second region II of the substrate 100 or on an area between the first and second regions I and II of the substrate may have a relatively large width, and thus all of the first to third division patterns 112, 114 and 116 may be formed therein.

The first to third division patterns 112 and 116 may include, for example, an oxide, e.g., silicon oxide, and the second division pattern 114 may include, for example, a nitride, e.g., silicon nitride.

The first active pattern 103 and the isolation pattern structure 110 on the first region I of the substrate 100 may be partially removed to form a second recess extending in the first direction D1.

A first gate structure 160 may be formed in the second recess. The first gate structure 160 may include a first gate insulation pattern 130 on a bottom and a sidewall of the second recess, a first gate electrode 140 on the first gate insulation pattern 130 and filling a lower portion of the second recess, and a gate mask 150 on the first gate electrode 140 and filling a upper portion of the second recess. The first gate structure 160 may extend in the first direction D1 on the first region I of the substrate 100, and a plurality of first gate structures 160 may be spaced apart from each other in the second direction D2.

The first gate insulation pattern 130 may include, for example, an oxide, e.g., silicon oxide, the first gate electrode 140 may include, for example, one or more of a metal, a metal nitride, a metal silicide, doped polysilicon, etc., and the gate mask 150 may include, for example, a nitride, e.g., silicon nitride.

Figure 4:
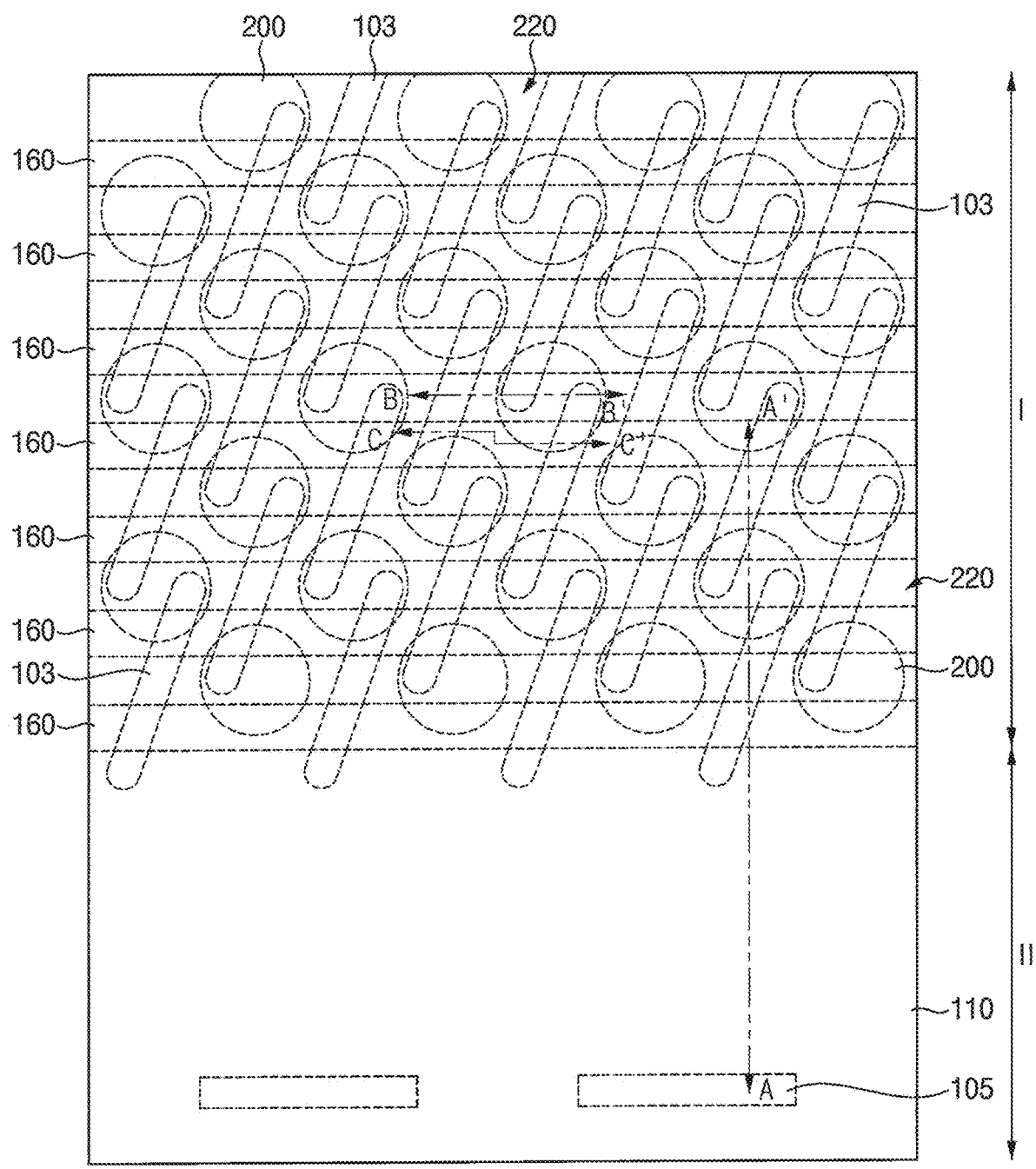
Figure 5:
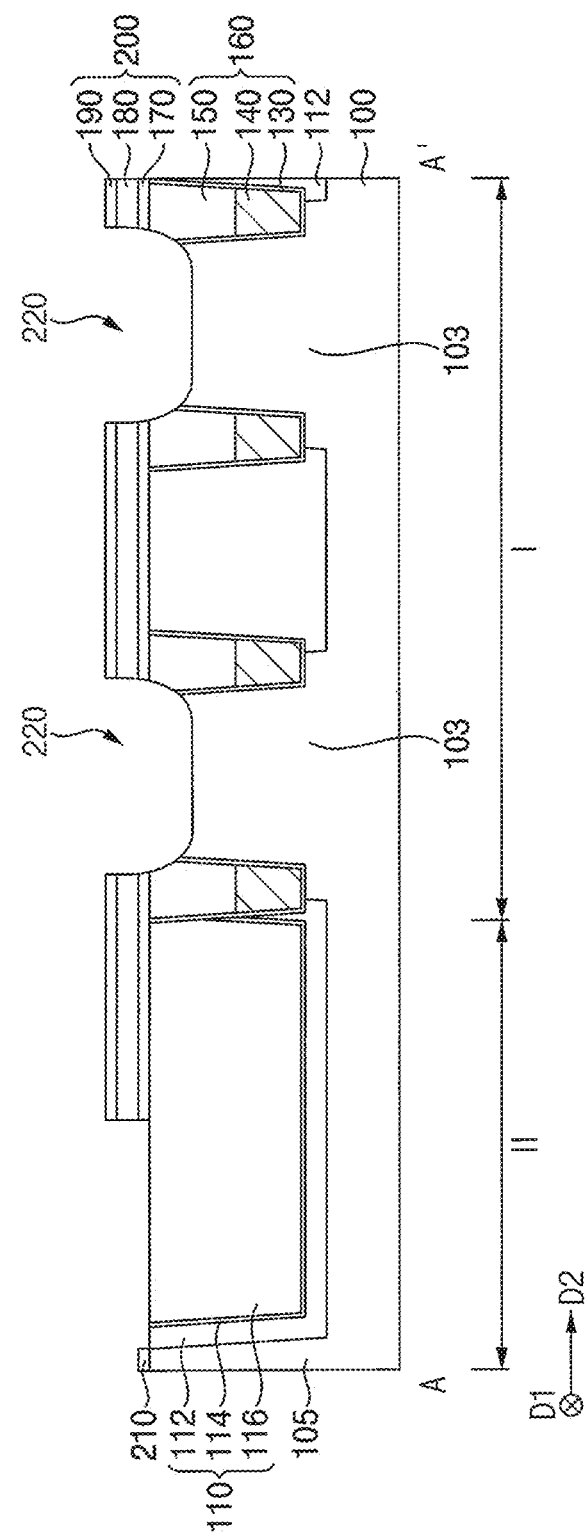
Figure 6:
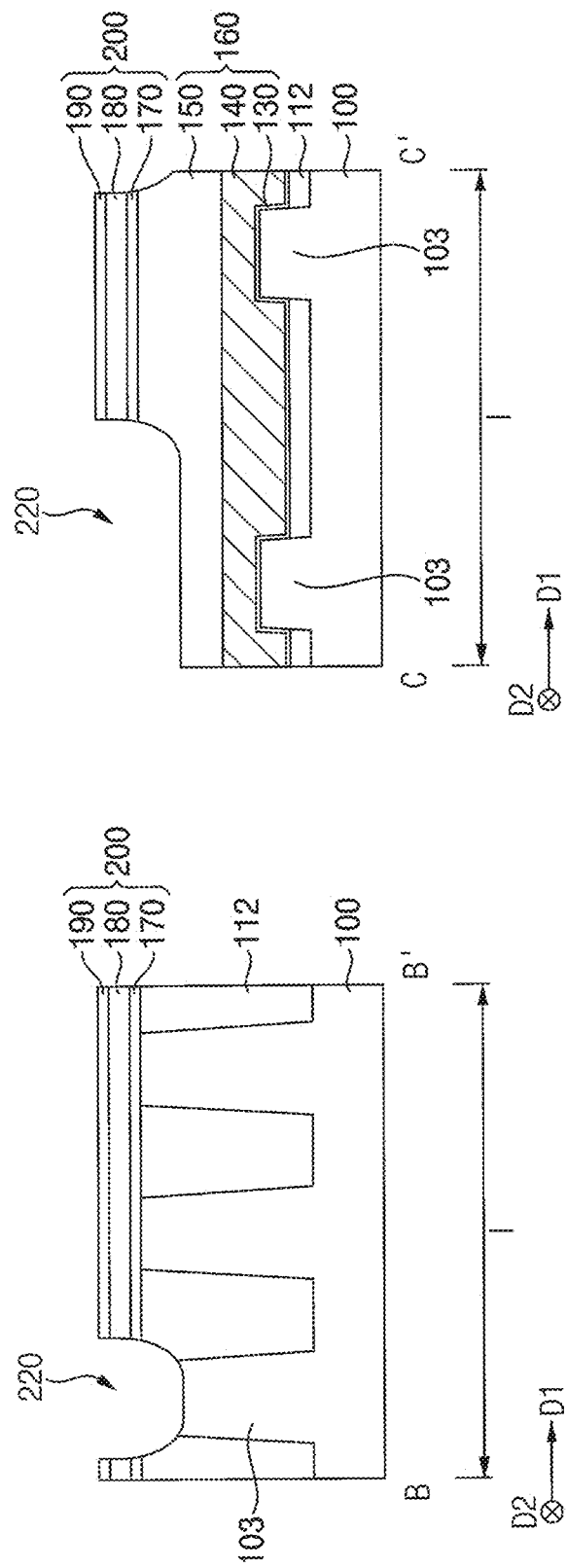

Referring to FIGS. 4 to 6, an insulation layer structure 200 may be formed on the first and second regions I and II of the substrate 100, a portion of the insulation layer structure 200 on the second region II of the substrate 100 may be removed, and a second gate insulation layer 210 may be formed on the second active pattern 105 on the second region II of the substrate 100 by, e.g., a thermal oxidation process.

The insulation layer structure 200 may include, for example, first, second and third insulation layers 170, 180 and 190 sequentially stacked, the first and third insulation layers 170 and 190 may include, for example, an oxide, e.g., silicon oxide, and the second insulation layer 180 may include a nitride, e.g., silicon nitride.

The insulation layer structure 200 may be patterned, and the first active pattern 103, the isolation pattern structure 110, and the first gate structure 160 may be partially etched using the patterned insulation layer structure 200 as an etching mask to form a first opening 220. According to at least some example embodiments of the inventive concepts, the insulation layer structure 200 remaining after the etching process may have a shape of a circle or ellipse in a plan view, and a plurality of insulation layer structures 200 may be spaced apart from each other in one or both of the first and second directions D1 and D2 on the first region I of the substrate 100. Each of the insulation layer structures 200 may overlap in a vertical direction substantially perpendicular to the upper surface of the substrate 100 end portions in the third direction D3 of the first active patterns 103 adjacent to each other. The term "vertical direction," as used in the present specification with respect to the substrate 100 or an element (or elements) directly or indirectly stacked on the substrate 100, refers to a direction that is perpendicular, or substantially perpendicular, to the upper surface of the substrate 100.

Figure 7:
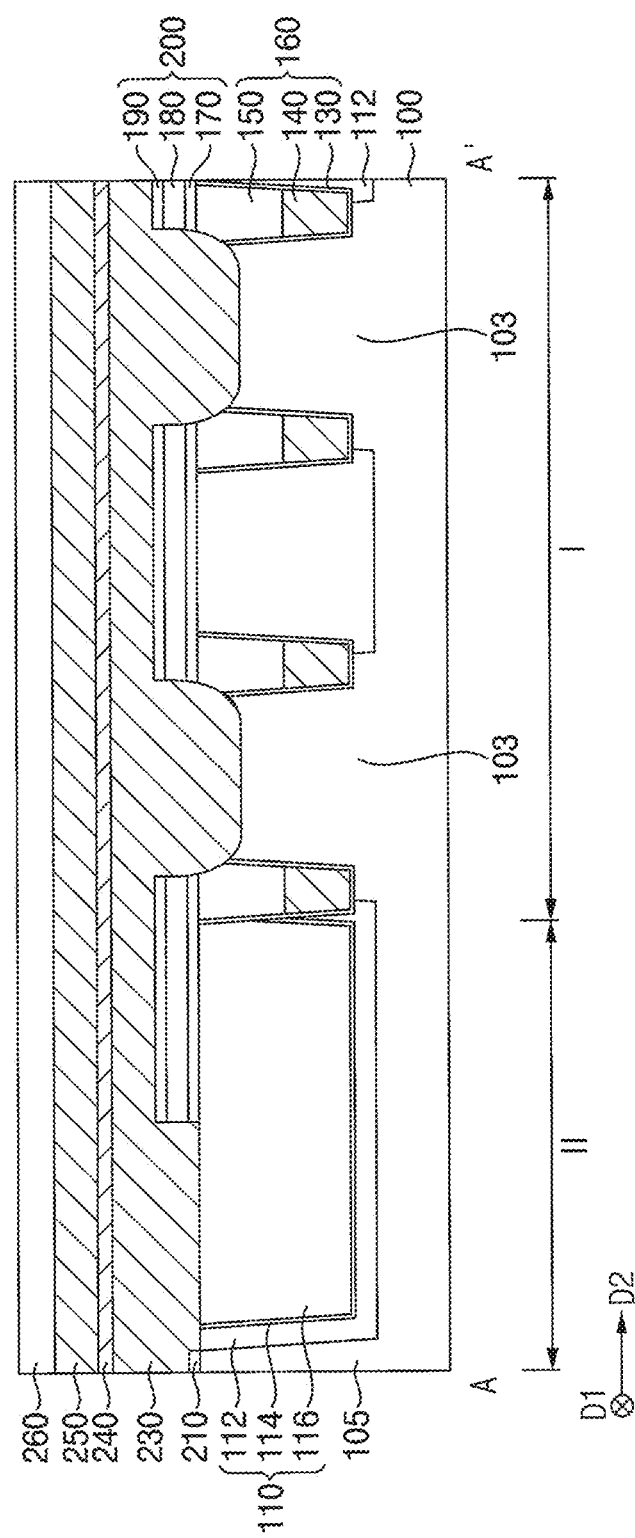
Figure 8:
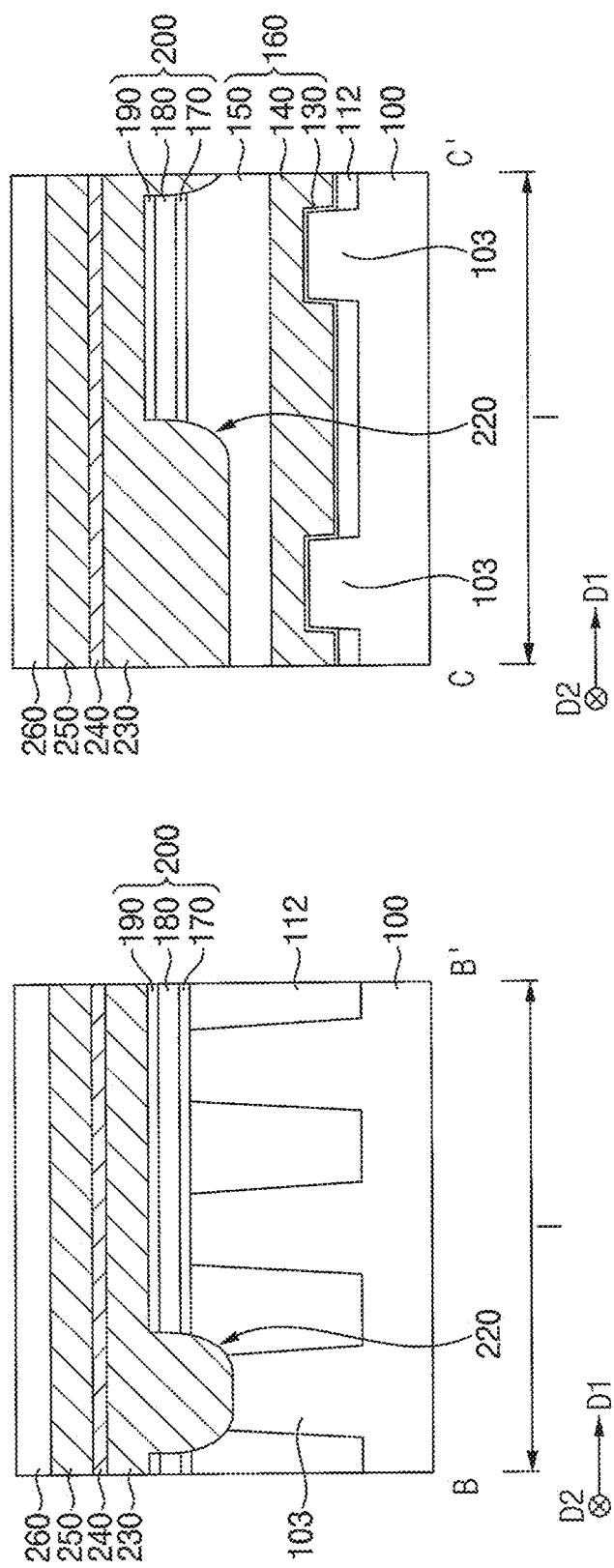

Referring to FIGS. 7 and 8, a first conductive layer 230, a first barrier layer 240, a second conductive layer 250 and a first capping layer 260 may be sequentially stacked on the insulation layer structure 200, the first active pattern 103 exposed by the first opening 220, the isolation pattern structure 110 and the first gate structure 160 on the first region I of the substrate 100, and the second gate insulation layer 210 and the isolation pattern structure 110 on the second region II of the substrate 100, which may form a conductive layer structure. The first conductive layer 230 may fill the first opening 220.

The first conductive layer 230 may include, e.g., doped polysilicon, the first barrier layer 240 may include, for example, a metal silicon nitride, e.g., titanium silicon nitride, the second conductive layer 250 may include, for example, a metal, e.g., tungsten, and the first capping layer 260 may include, for example, a nitride, e.g., silicon nitride.

Figure 9:
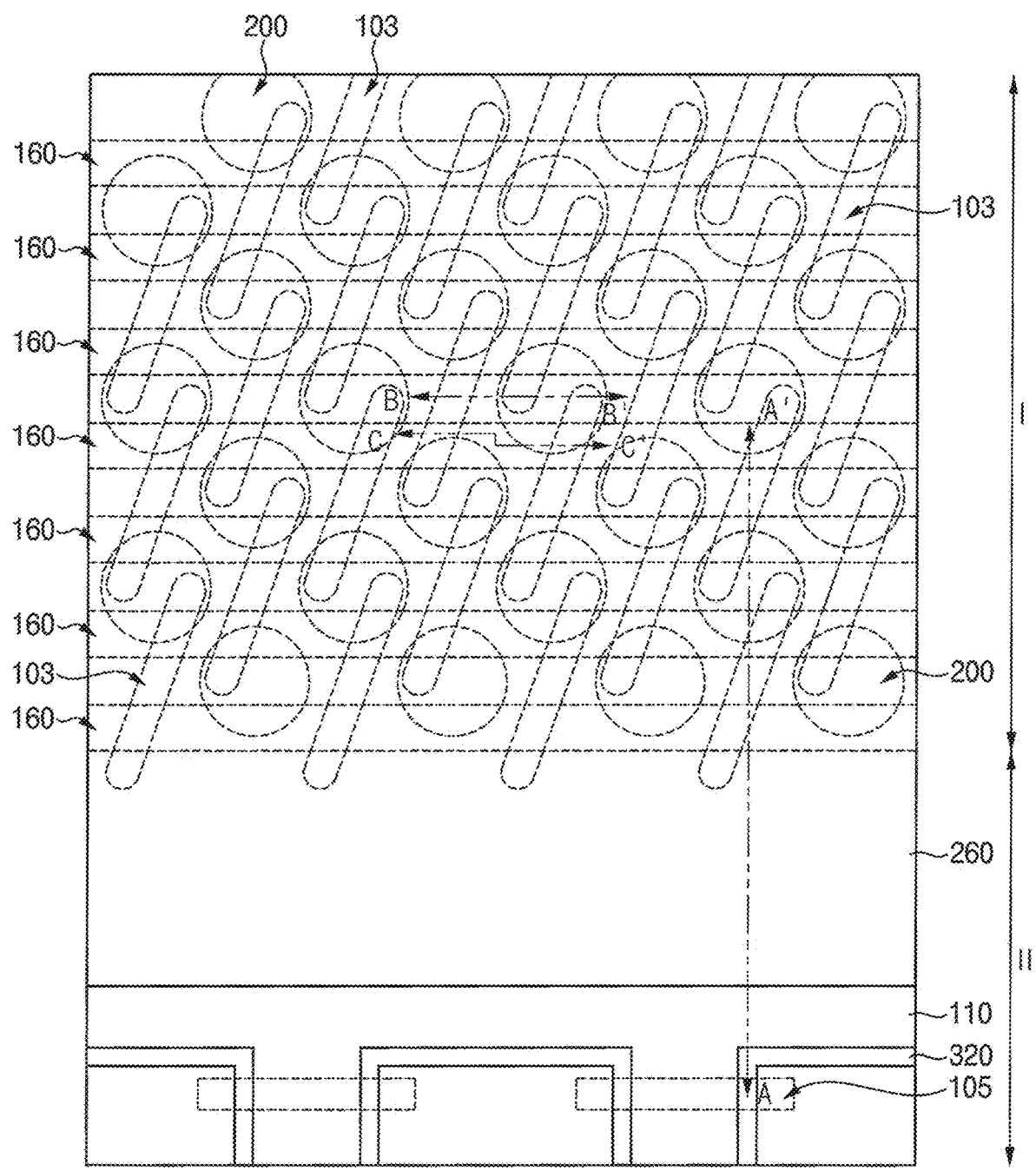
Figure 10:
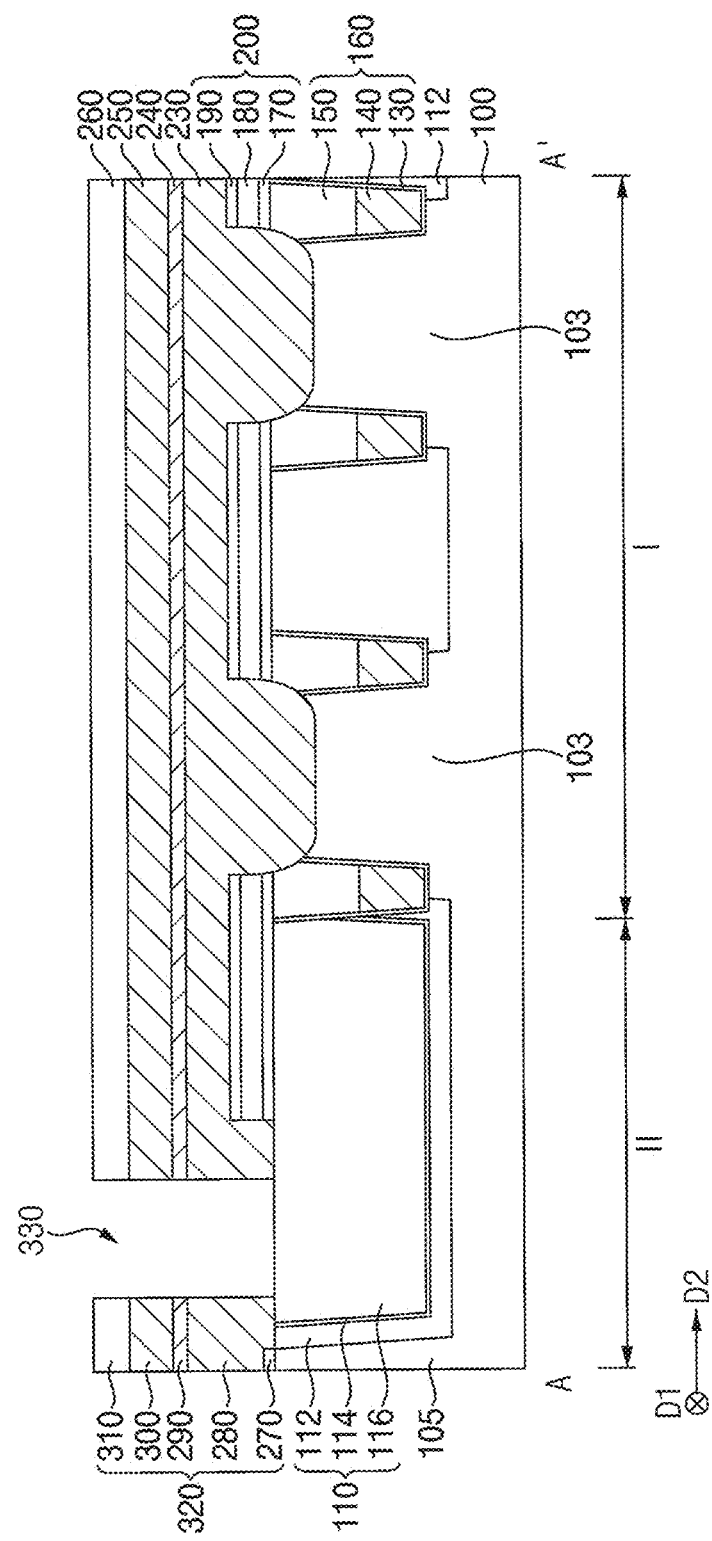

Referring to FIGS. 9 and 10, a second opening 330 may be formed etching the portion of the conductive layer structure on the second region II of the substrate 100 adjacent to the second active pattern 105. An upper surface of a portion of the isolation pattern structure 110 on the second region II of the substrate 100 may be exposed by the second opening 330, and a second gate structure 320 may be formed on the second region II of the substrate 100.

The second gate structure 320 may include a second gate insulation pattern 270, a conductive pattern 280, a first barrier pattern 290, a second conductive pattern 300 and a first capping pattern 310 sequentially stacked in the vertical direction, and the first conductive pattern 280, the first barrier pattern 290 and the second conductive pattern 300 may form a second gate electrode.

The second gate structure 320 may partially overlap the second active pattern 105 in the vertical direction on the second region II of the substrate 100. In the drawing, three second gate structures 320 spaced apart from each other in the second direction D2 are shown, however, at least some example embodiments of the inventive concepts may not be limited thereto.

Figure 11:
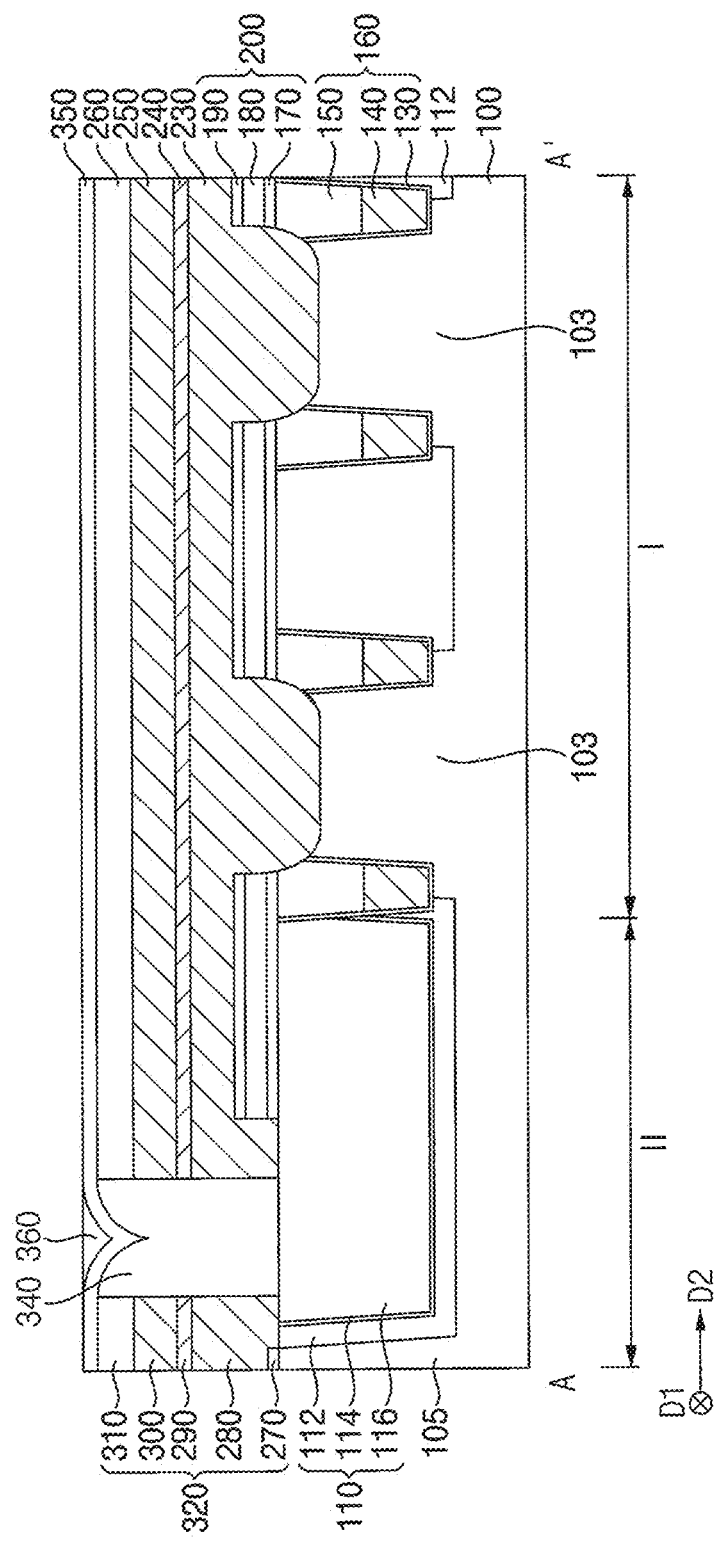
Figure 12:
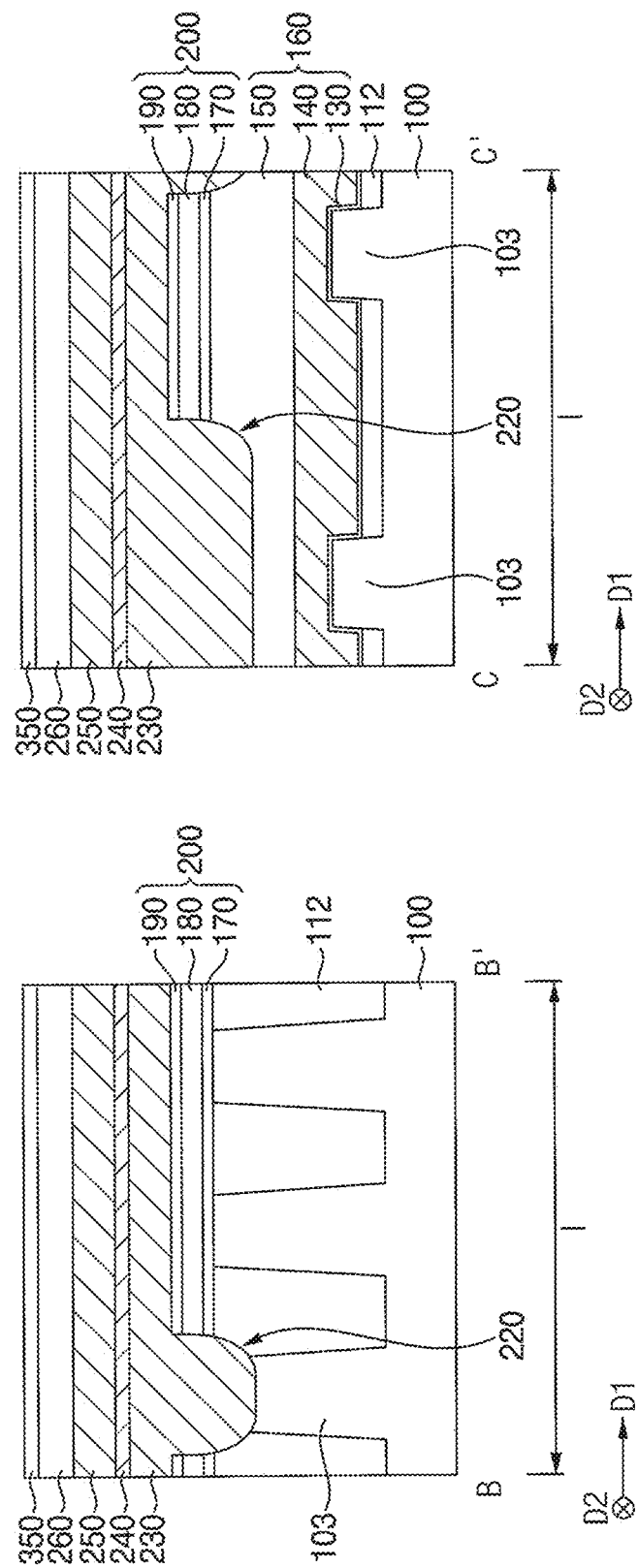

Referring to FIGS. 11 and 12, a first spacer 340 may be formed by forming a first spacer layer on the conductive layer structure, the second gate structure 320 and the isolation pattern structure 110, and anisotropically etching the first spacer layer.

According to at least some example embodiments of the inventive concepts, the first spacer layer may be formed to fill a portion of the second opening 330, and an upper surface of a portion of the first spacer layer in the second opening 330 may be concave.

The first spacer 340 may include, for example, an oxide, e.g., silicon oxide.

A first etch stop layer 350 may be formed on the conductive layer structure, the second gate structure 320 and the first spacer 340. The first etch stop layer 350 may include, for example, a nitride, e.g., silicon nitride.

A first insulating interlayer 360 may be formed on the first etch stop layer 350, an upper portion of the first insulating interlayer 360 may be planarized until an upper surface of the first etch stop layer 350 on an upper surface of the second gate structure 320 and an upper surface of the conductive layer structure is exposed. Thus, the first insulating interlayer 360 may fill a remaining portion of the second opening 330.

The first insulating interlayer 360 may include, for example, an oxide, e.g., silicon oxide.

Figure 13:
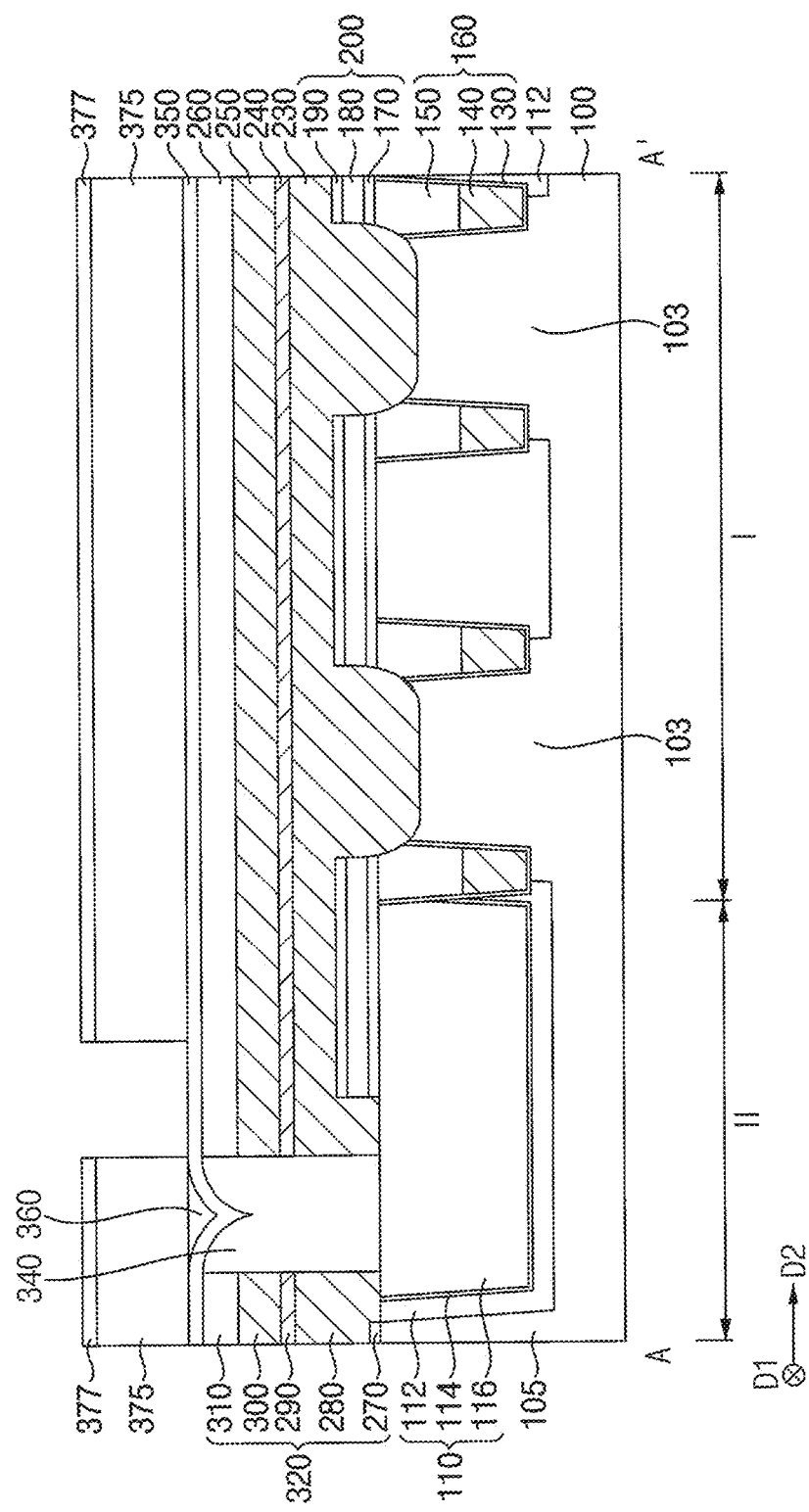
Figure 14:
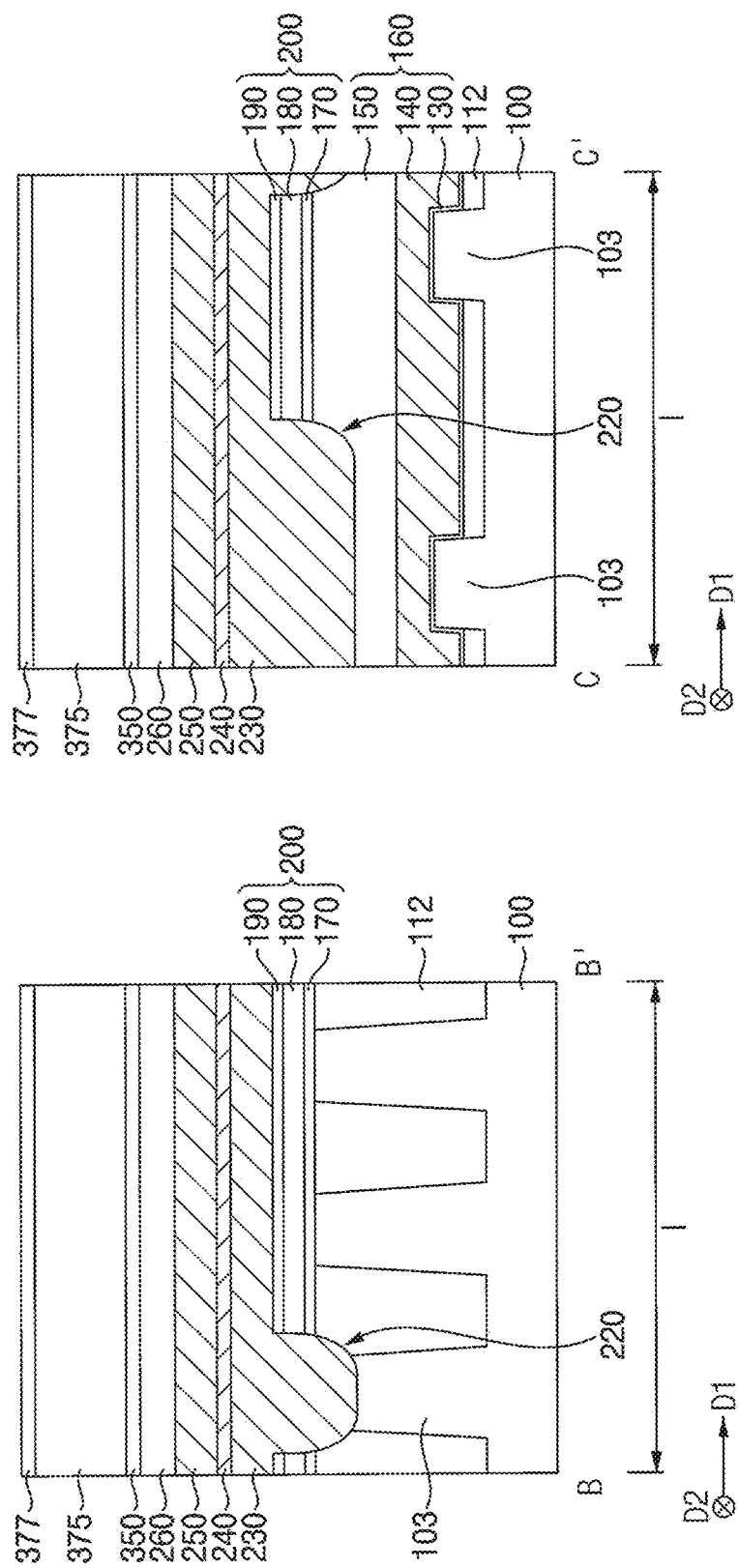

Referring to FIGS. 13 and 14, a mask pattern structure may be formed on the first etch stop layer 350 and the first insulating interlayer 360. The mask pattern structure may be formed to expose an upper surface of a portion of the first etch stop layer 350 on an end portion in the second direction D2 of the conductive layer structure, and may include first and second mask patterns 375 and 377 sequentially stacked in the vertical direction.

After forming first and second mask layers on the first insulating interlayer 360 sequentially stacked, the photoresist pattern (not shown) may be formed on the second mask layer, and the first and second mask patterns 375 and 377 may be formed patterning a portion of the first and second mask layers exposed by the photoresist pattern.

The first mask pattern 375 may include, e.g., carbon (C), and the second mask pattern 377 may include, for example, an oxynitride, e.g., silicon oxynitride.

However, a configuration of the mask pattern structure may not be limited to the above, and the mask pattern structure may include a single mask pattern, or may include three or more mask patterns stacked.

The photoresist pattern may be removed.

Figure 15:
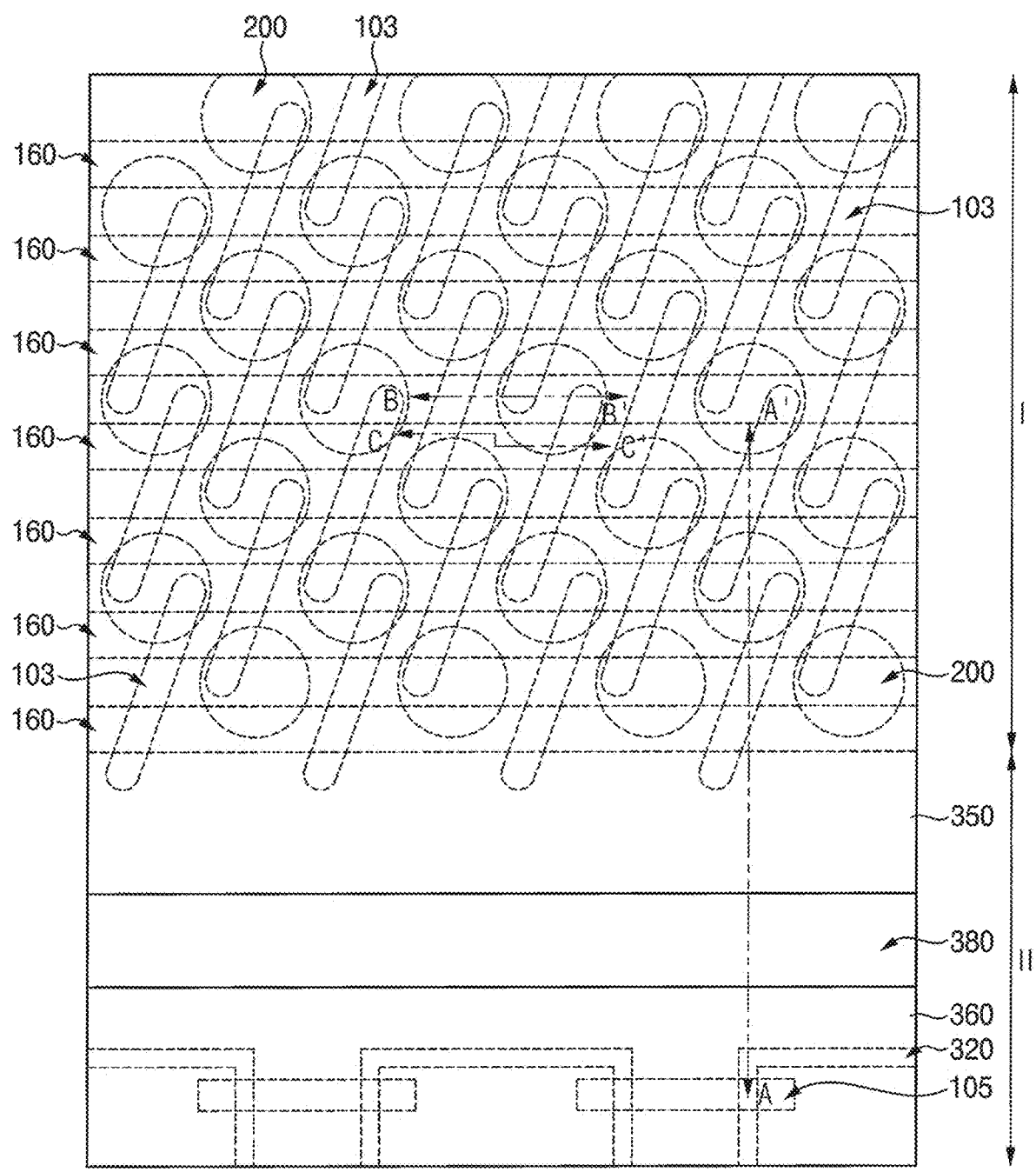
Figure 16:
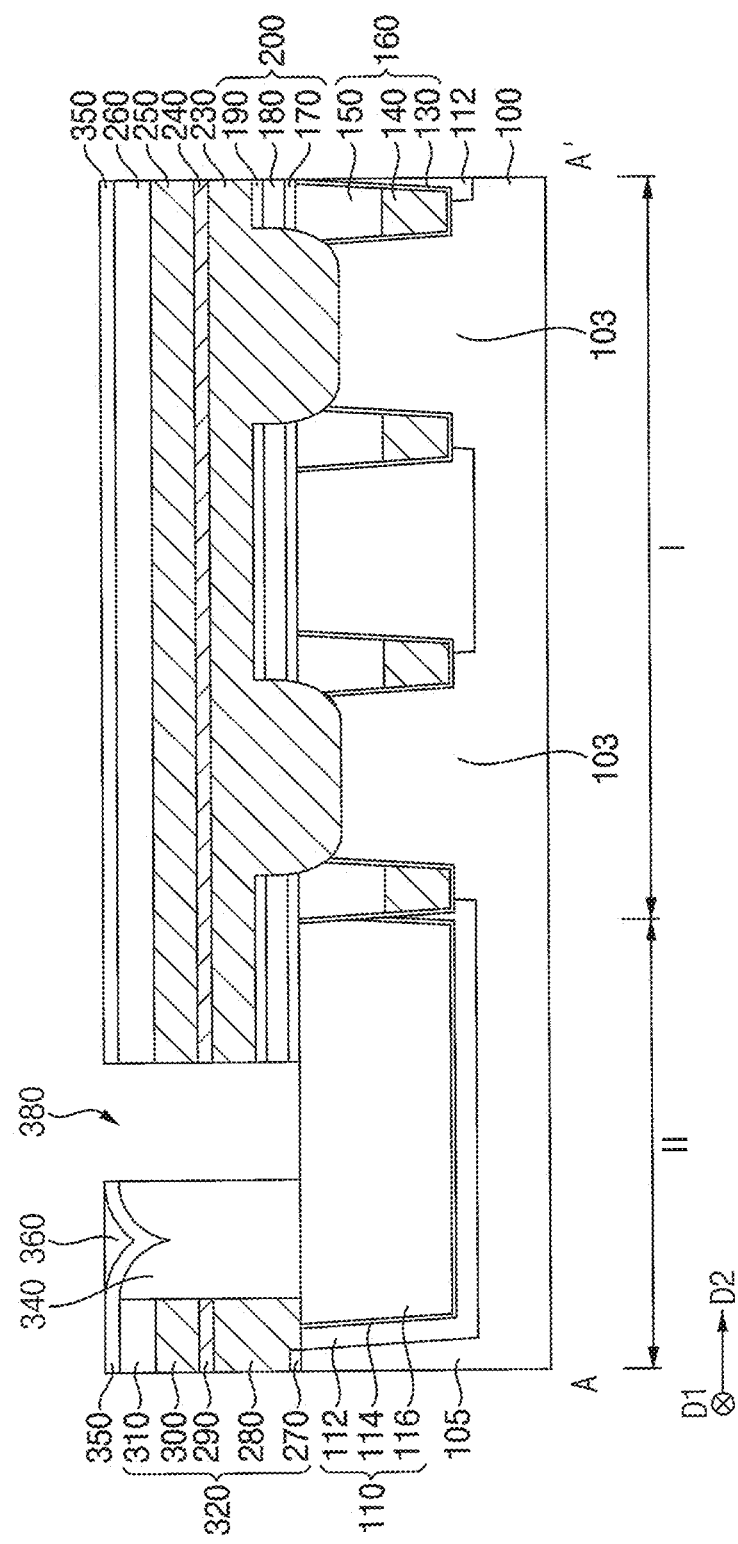

Referring to FIGS. 15 and 16, a portion of the conductive layer structure and a portion of the insulation layer structure 200 exposed by the mask pattern structure may be patterned to form the third opening 380 on the isolation pattern structure 110. An upper surface of a portion of the isolation pattern structure 110 on the second region II of the substrate 100 may be exposed by the third opening 380.

The mask pattern structure may be removed.

Figure 17:
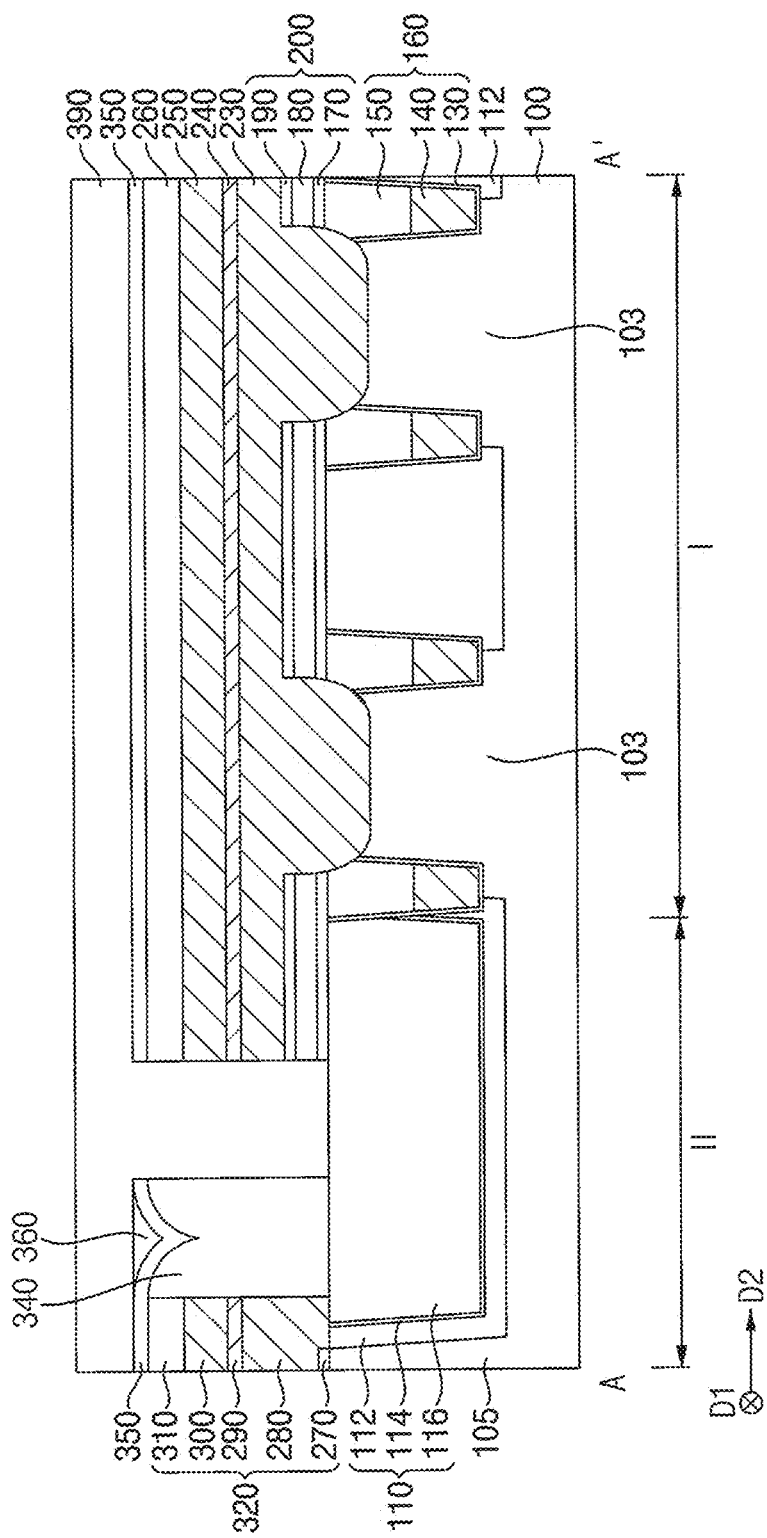
Figure 18:
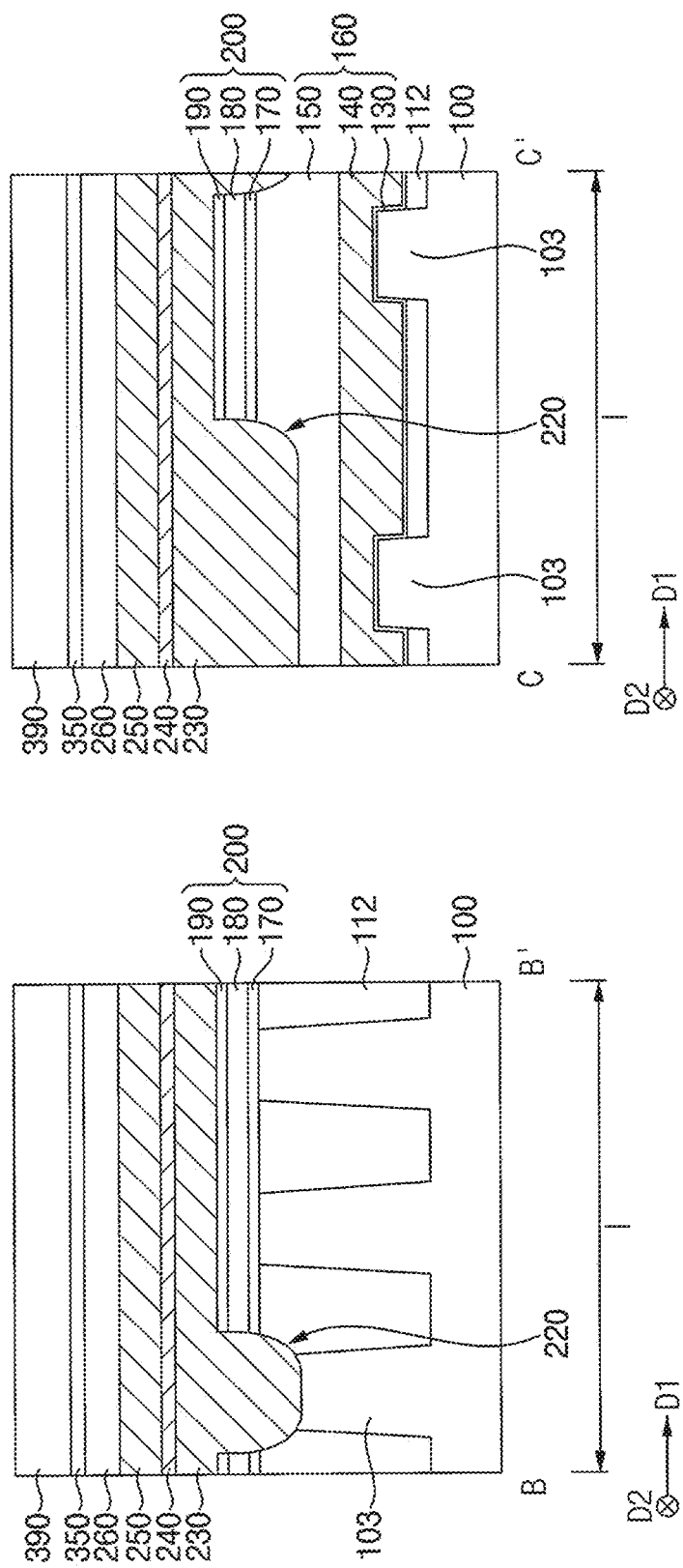
Figure 19:
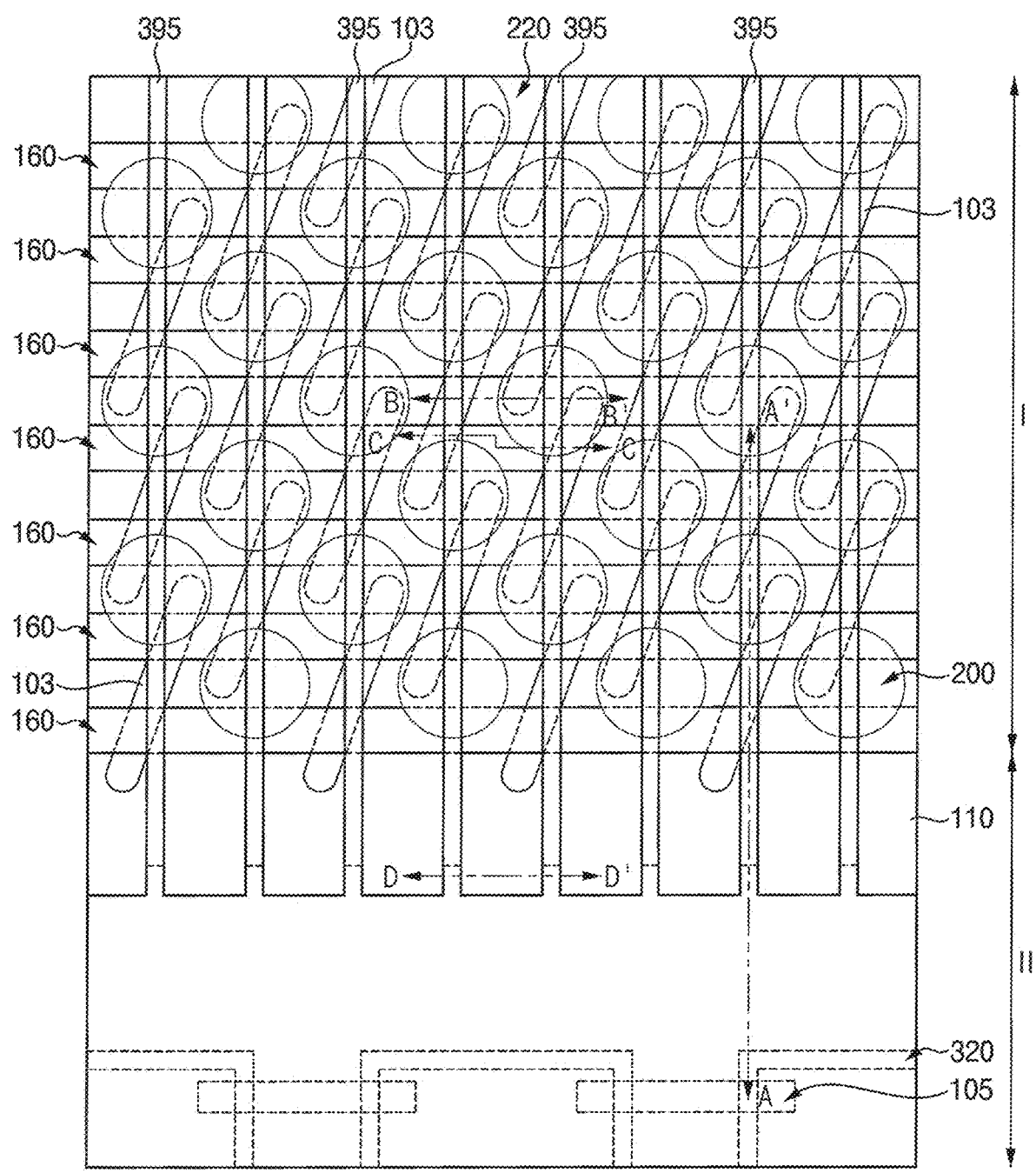
Figure 20:
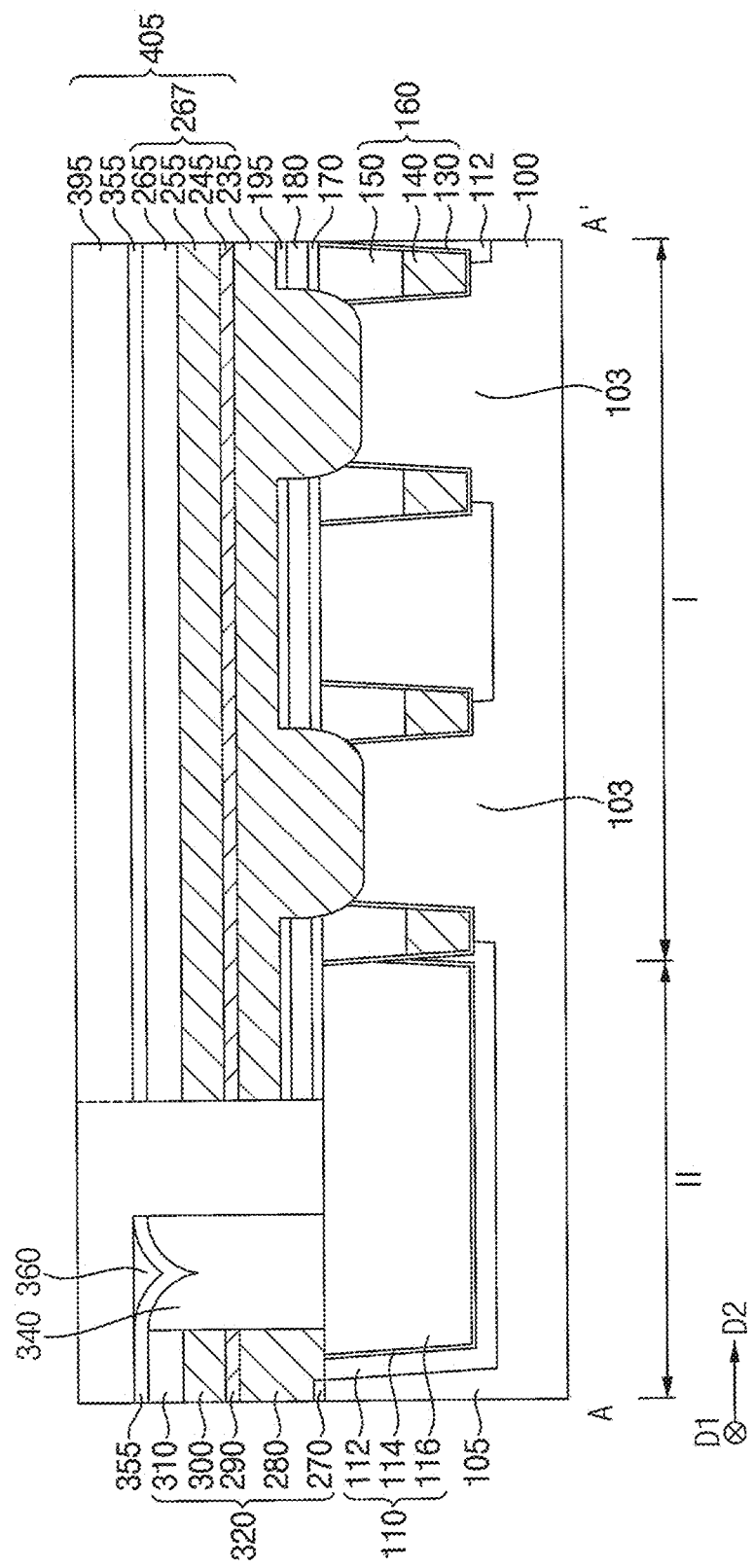
Figure 21:
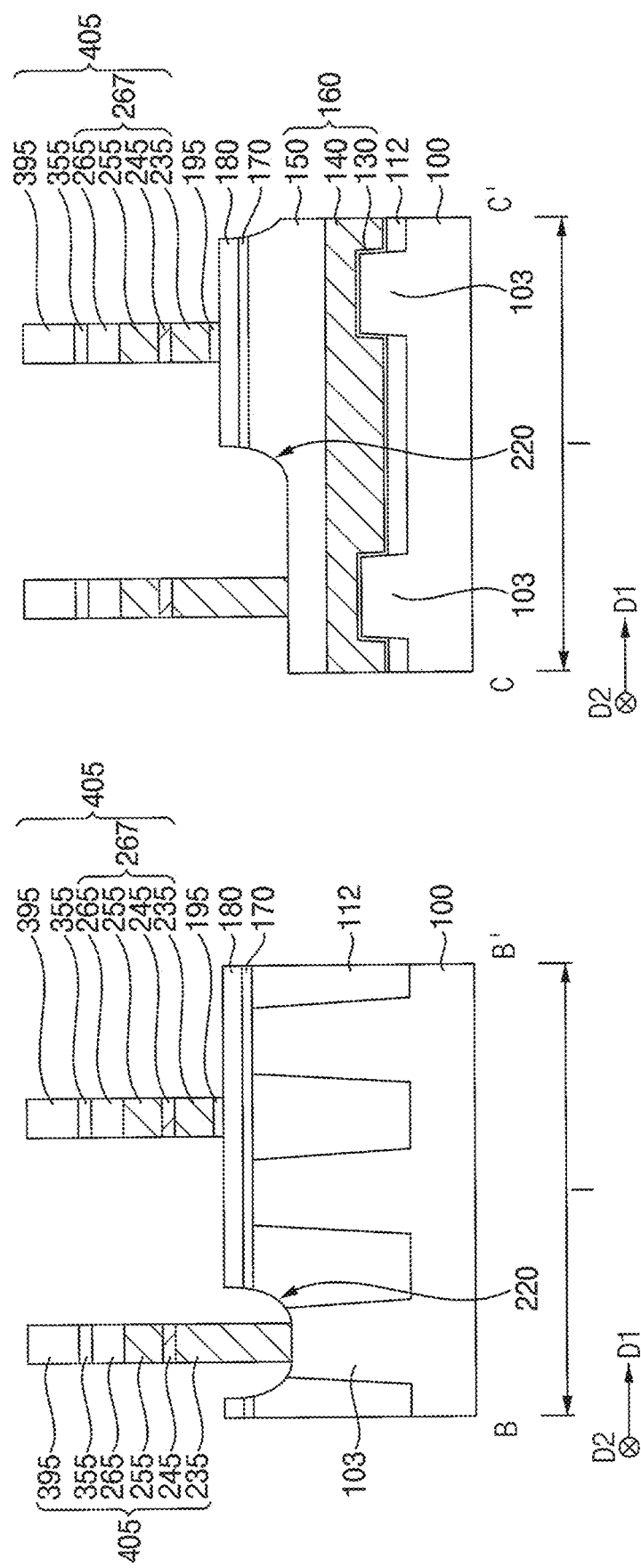
Figure 22:
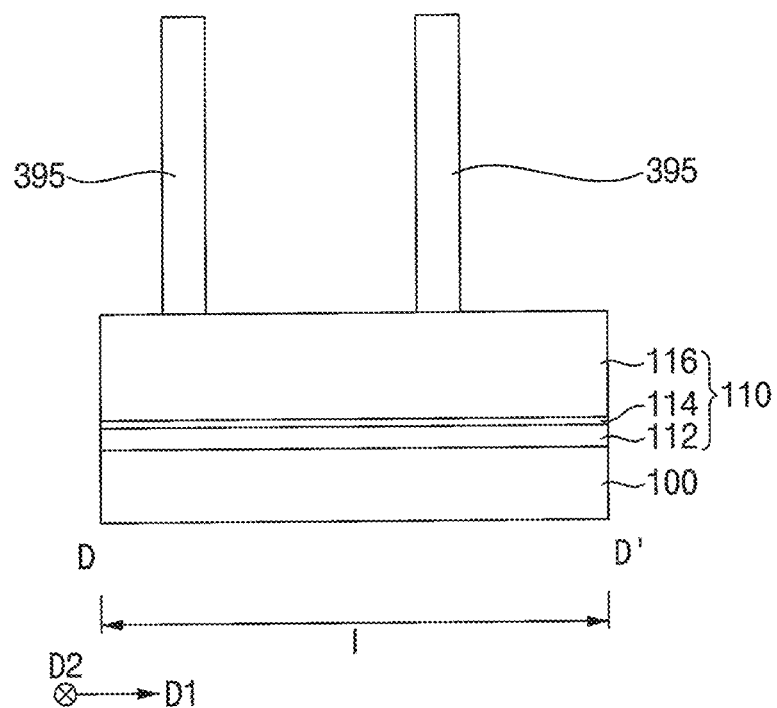

Referring to FIGS. 17 and 18, a second capping layer 390 may be formed to fill the third opening 380 on the first etch stop layer 350.

The second capping layer 390 may include, for example, a nitride, e.g., silicon nitride.

Referring to FIGS. 19 to 22, a portion of the second capping layer 390 on the first region I and a portion of the second region II adjacent to the first region I of the substrate 100 may be etched to form a second capping pattern 395. A portion of the second capping layer 390 in contact with an upper surface of the isolation pattern structure 110 may also be etched together.

In one embodiment, in the portion of the second capping layer 390 in contact with the upper surface of the isolation pattern structure 110, a portion of the second capping layer 390 in contact with a sidewall of the first spacer 340 may not be etched.

The first etch stop layer 350, the first capping layer 260, the second conductive layer 250, the first barrier layer 240 and the first conductive layer 230 may be sequentially etched using the second capping pattern 395 as an etching mask.

By the etching process, on the first region I and the portion of the second region II adjacent to the first region I of the substrate 100, the third conductive pattern 235, the second barrier pattern 245, the fourth conductive pattern 255, the third capping pattern 265, the first etch stop pattern 355 and the second capping pattern 395 may be sequentially stacked on the first opening 220, and a third insulation pattern 195, the third conductive pattern 235, the second barrier pattern 245, the fourth conductive pattern 255, the third capping pattern 265, the first etch stop pattern 355 and the second capping pattern 395 may be sequentially stacked on the second insulation layer 180 at an outside of the first opening 220.

Hereinafter, the third conductive pattern 235, the second barrier pattern 245, the fourth conductive pattern 255 and the third capping pattern 265 sequentially stacked on the first region I and the portion of the second region II adjacent to the first region I of the substrate 100 may be referred to as a conductive structure 267, and the conductive structure 267, the first etch stop pattern 355 and the second capping pattern 395 sequentially stacked may be referred to as a bit line structure 405.

The second capping pattern 395 in contact with the upper surface of the isolation pattern structure 110 may be formed on the portion of the second region II adjacent to the first region I of the substrate 100.

According to at least some example embodiments of the inventive concepts, the bit line structure 405 and a portion of the second capping pattern 395 in contact with the upper surface of the isolation pattern structure 110 may extend in the second direction D2 on the first region I and the portion of the second region II adjacent to the first region I of the substrate 100, and a plurality of bit line structures 405 and portion of the second capping pattern 395 in contact with the upper surface of the isolation pattern structure 110 may be spaced apart from each other in the first direction D1.

According to at least some example embodiments of the inventive concepts, the etching process may be performed by, e.g., a dry etching process using tungsten (W), oxygen (O) and chlorine (Cl) as an etching gas. In the etching process, an etching rate of the second conductive layer 250 including a metal and an etching rate of the second capping pattern 395 including a nitride may be the same or similar to each other. Thus, a width in the first direction D1 of the second conductive layer 250 and a width in the first direction D1 of the portion of the second capping pattern 395 in contact with the upper surface of the isolation pattern structure 110 may be the same or similar to each other. That is, a width in the first direction D1 of the conductive structure 267 and the width in the first direction D1 of the portion of the second capping pattern 395 in contact with the upper surface of the isolation pattern structure 110 may be the same or similar to each other.

Figure 23:
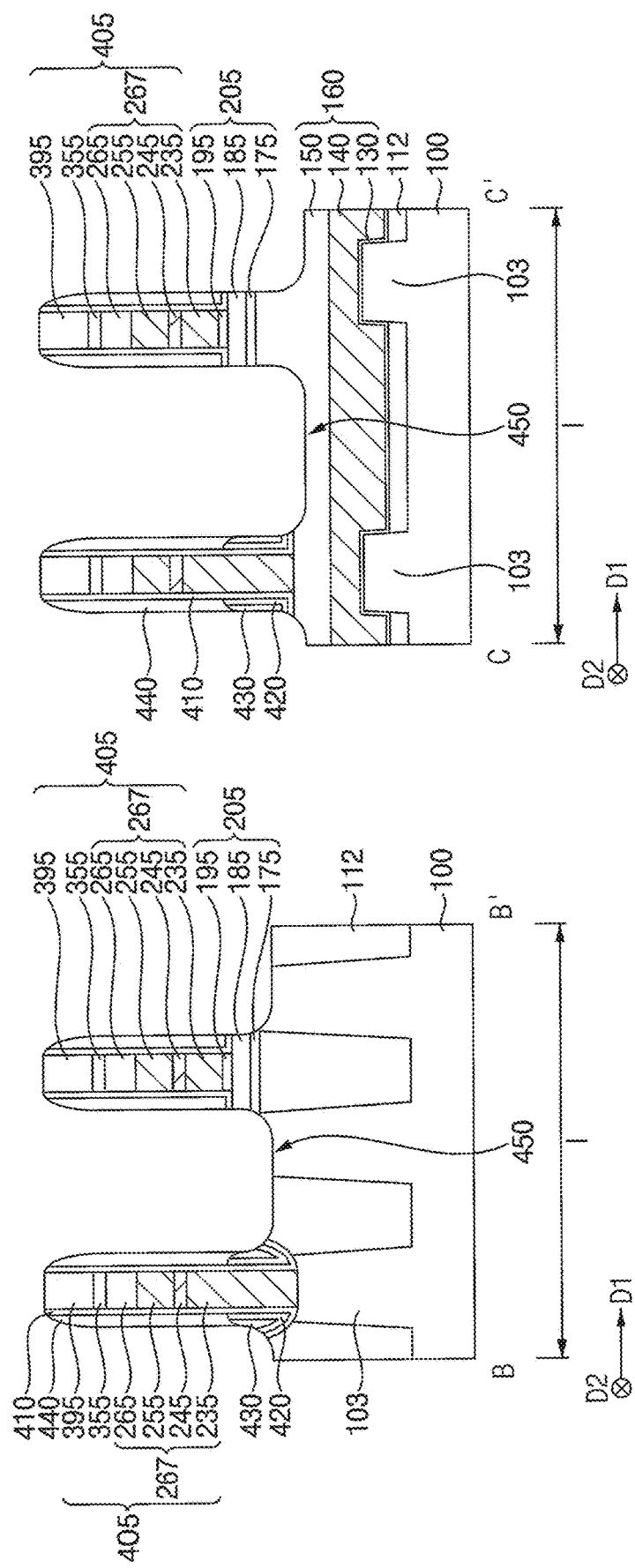

Referring to FIG. 23, a second layer may be formed on the substrate 100 having the bit line structure 405 and the second capping layer 395 thereon, and fourth and fifth insulation layers may be sequentially formed on the second spacer layer.

The second spacer layer may cover a sidewall of the third insulation pattern 195 under a portion of the bit line structure 405 on the second insulation layer 180, and the fifth insulation layer may fill a remaining portion of the first opening 220.

The second spacer layer may include, for example, a nitride, e.g., silicon nitride, the fourth insulation layer may include, for example, an oxide, e.g., silicon oxide, and the fifth insulation layer may include, for example, a nitride, e.g., silicon nitride.

The fourth and fifth insulation layers may be etched by an etching process. According to at least some example embodiments of the inventive concepts, the etching process may be performed by a wet etching process using phosphoric acid ($H_3PO_4$), SC1 solution, and hydrogen fluoride (HF) as an etching solution, and thus all portions of the fourth and fifth insulation layers except for a portion thereof in the first opening 220 may be removed. Accordingly, almost an entire surface of the second spacer layer, that is, the entire surface of the second spacer layer except for the surface in the first opening 220 may be exposed, and the fourth and fifth insulation layers remaining in the first opening 220 may be transformed into fourth and fifth insulation patterns 420 and 430, respectively.

A third spacer layer may be formed on the fourth and fifth insulation patterns 420 and 430 on the exposed surface of the second spacer layer and in the first opening 220, and may be anisotropically etched to form a third spacer 440 covering a sidewall of the bit line structure 405 on the surface of the second spacer layer and the fourth and fifth insulation patterns 420 and 430. The third spacer 440 may also be formed on a sidewall of the portion of the second capping pattern 395 in contact with the upper surface of the isolation pattern structure 110. The third spacer layer may include, for example, an oxide, e.g., silicon oxide.

A dry etching process may be performed using the second capping pattern 395 and the third spacer 440 as an etching mask to form a fourth opening 450 exposing an upper surface of the first active pattern 103, and the upper surface of the isolation pattern structure 110 and an upper surface of the gate mask 150 may also be exposed by the second opening 440.

By the dry etching process, portions of the second spacer layer on the upper surfaces of the second capping pattern 395 and the second insulation layer 180 may be removed, and thus a second spacer 410 may be formed to cover the sidewall of the bit line structure 405. The second spacer 410 may also cover the sidewall of the portion of the second capping pattern 395 in contact with the upper surface of the isolation pattern structure 110.

Additionally, by the dry etching process, the first and second insulation layers 170 and 180 may be partially removed so as to remain under the bit line structure 405 as first and second insulation patterns 175 and 185, respectively. The first to third insulation patterns 175, 185 and 195 sequentially stacked under the bit line structure 405 may form an insulation pattern structure 205.

Figure 24:
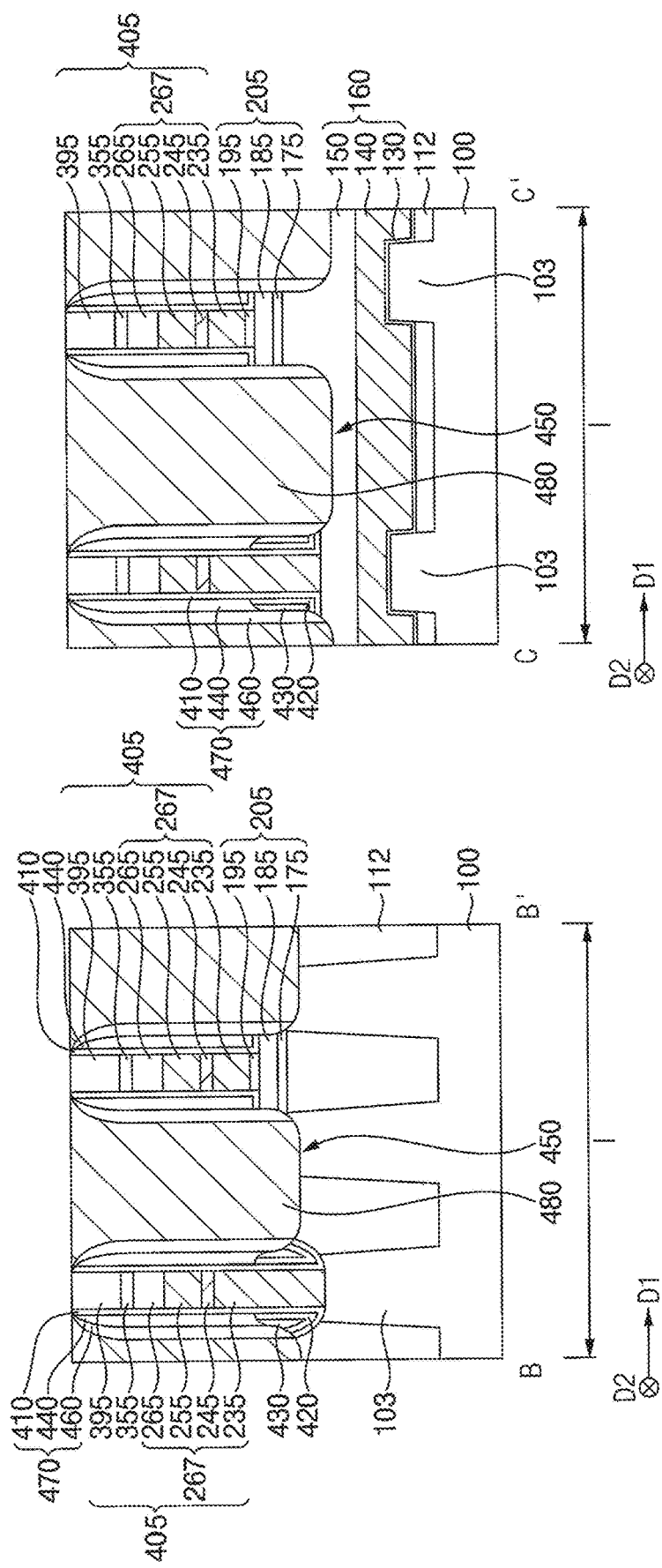

Referring to FIG. 24, a fourth spacer layer may be formed on a upper surface of the second capping pattern 395, an outer sidewall of the third spacer 440, upper surfaces of the fourth and fifth insulation patterns 420 and 430, and the upper surfaces of the first active pattern 103, the isolation pattern structure 110 and the gate mask 150 exposed by the fourth opening 450, and anisotropically etched to form a third spacer 440 covering the sidewall of the bit line structure 405. The fourth spacer layer may include, for example, a nitride, e.g., silicon nitride.

The second to fourth spacers 410, 440 and 460 sequentially stacked in the horizontal direction from the sidewall of the bit line structure 405 and the sidewall of the portion of the second capping pattern 395 in contact with the upper surface of the isolation pattern structure 110 on the first region I and the portion of the second region II adjacent to the first region I of the substrate 100 may be referred to as a preliminary spacer structure 470.

A lower contact plug layer 480 may be formed to fill the fourth opening 450 on the first region I and the portion of the second region II adjacent to the first region I of the substrate 100, and may be planarized until the upper surfaces of the second capping pattern 395 is exposed.

In example embodiment, the lower contact plug layer 480 may extend in the second direction D2, and a plurality of lower contact plug layers 480 may be spaced apart from each other in the first direction D1 by the bit line structure 405 and the portion of the second capping pattern 395 in contact with the upper surface of the isolation pattern structure 110. The lower contact plug layer 480 may include, e.g., doped polysilicon.

Figure 25:
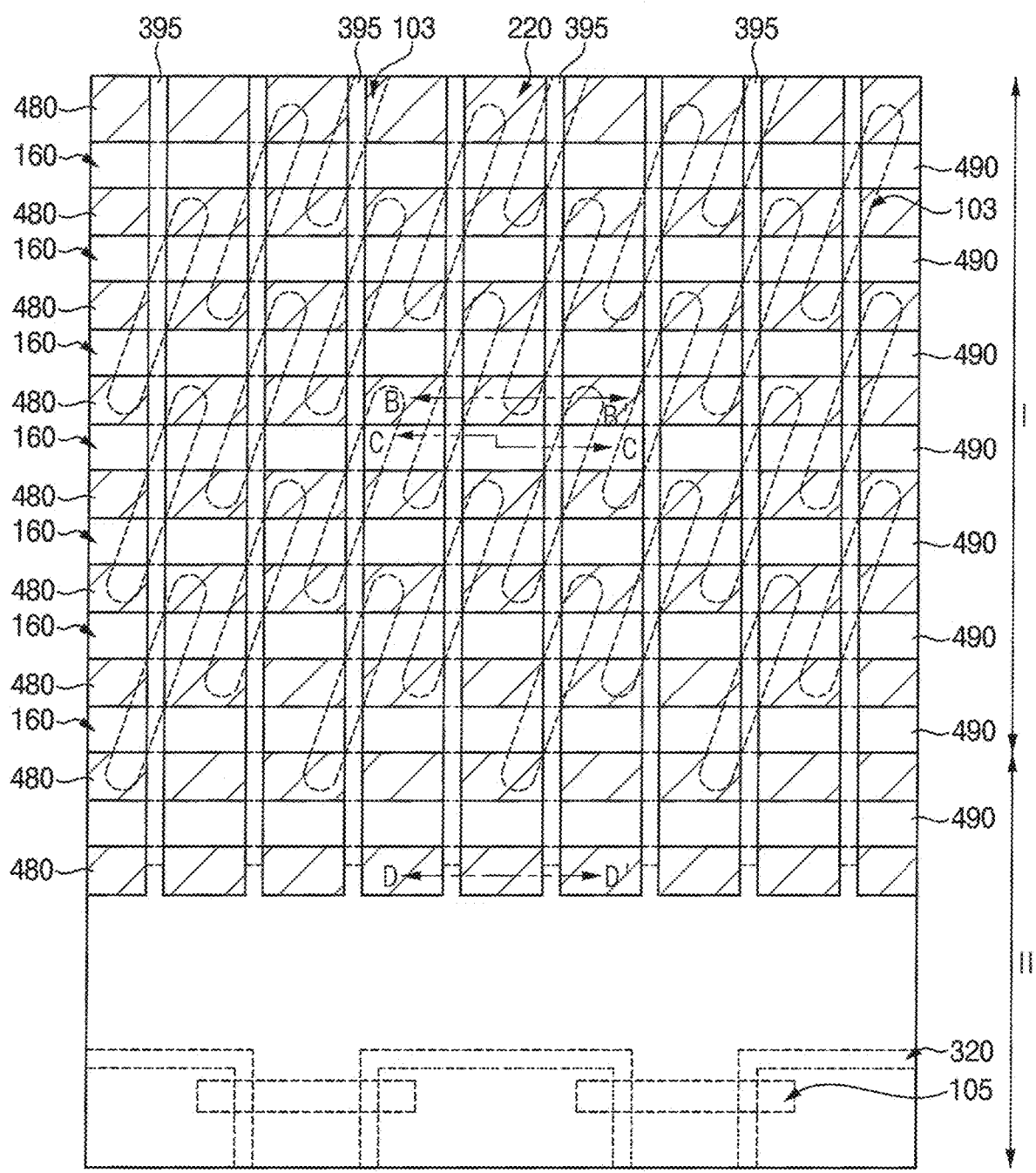
Figure 26:
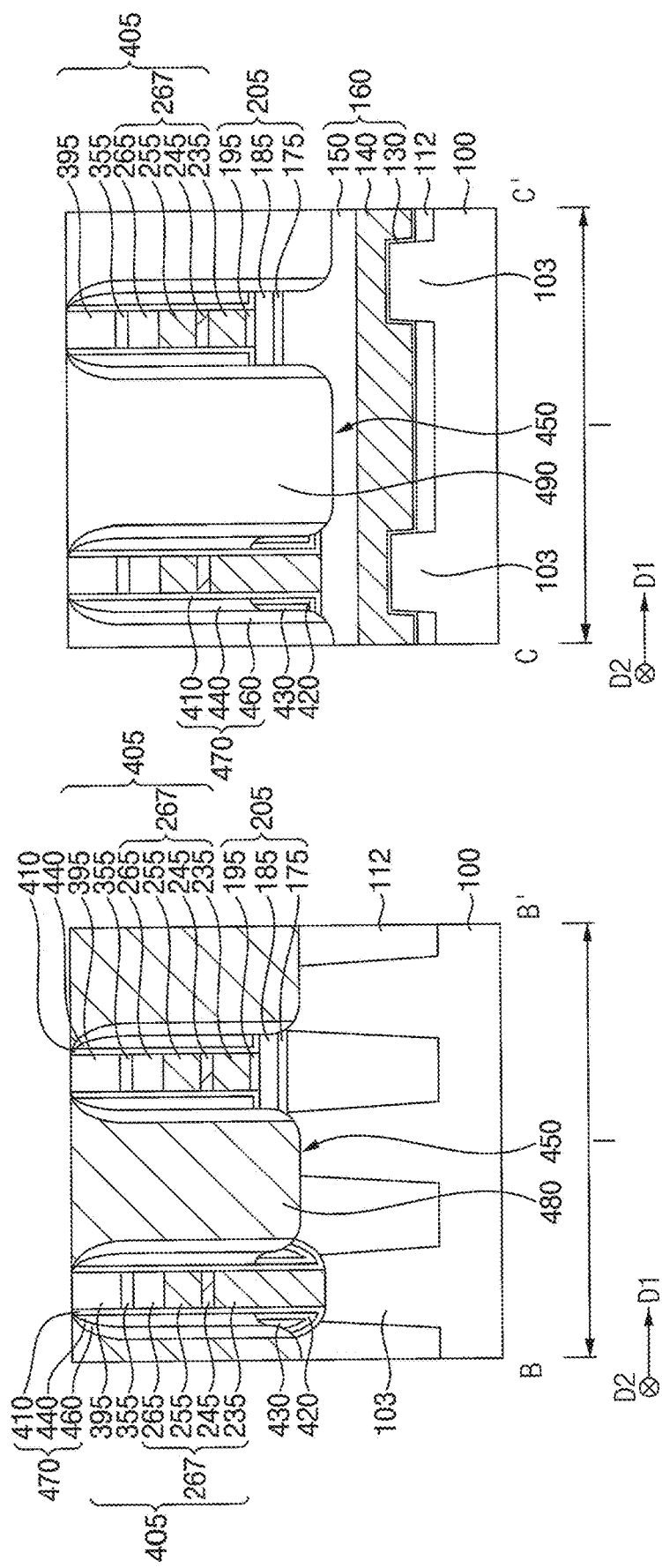
Figure 27:
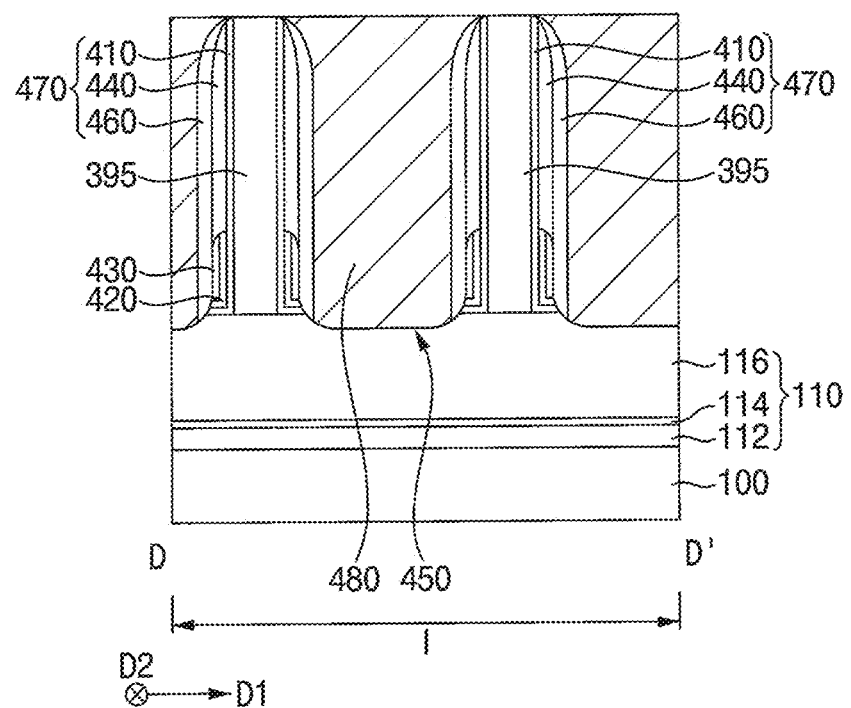

Referring to FIGS. 25 to 27, a third mask (not shown) including fifth openings, each of which may extend in the first direction D1, spaced apart from each other in the second direction D2 may be formed on the second capping pattern 395 and the lower contact plug layer 480 on the first region I and the portion of the second region II adjacent to the first region I of the substrate 100, and the lower contact plug layer 480 may be etched using the third mask as an etching mask.

According to at least some example embodiments of the inventive concepts, each of the fifth openings may overlap the first gate structure 160 in the vertical direction on the first region I of the substrate 100. By the etching process, a sixth opening may be formed to expose the upper surface of the gate mask 150 of the first gate structure 160 between the bit line structures 405 and between the portions of the second capping patterns 395 in contact with the upper surface of the isolation pattern structure 110 on the first region I and the portion of the second region II adjacent to the first region I of the substrate 100.

After removing the third mask, a fourth capping pattern 490 may be formed on the first region I and the portion of the second region II adjacent to the first region I of the substrate 100 to fill the sixth opening. The fourth capping pattern 490 may include, for example, a nitride, e.g., silicon nitride. According to at least some example embodiments of the inventive concepts, the fourth capping pattern 490 may extend in the first direction D1 between the bit line structures 405 and between the portions of the second capping patterns 395 in contact with the upper surface of the isolation pattern structure 110, and a plurality of fourth capping patterns 490 may be formed in the second direction D2.

Thus, the lower contact plug layer 480 extending in the second direction D2 between the bit line structures 405 and between the portions of the second capping patterns 395 in contact with the upper surface of the isolation pattern structure 110 may be divided into a plurality of lower contact plugs 485 spaced apart from each other in the second direction D2 by the fourth capping patterns 490 on the first region I and the portion of the second region II adjacent to the first region I of the substrate 100.

Figure 28:
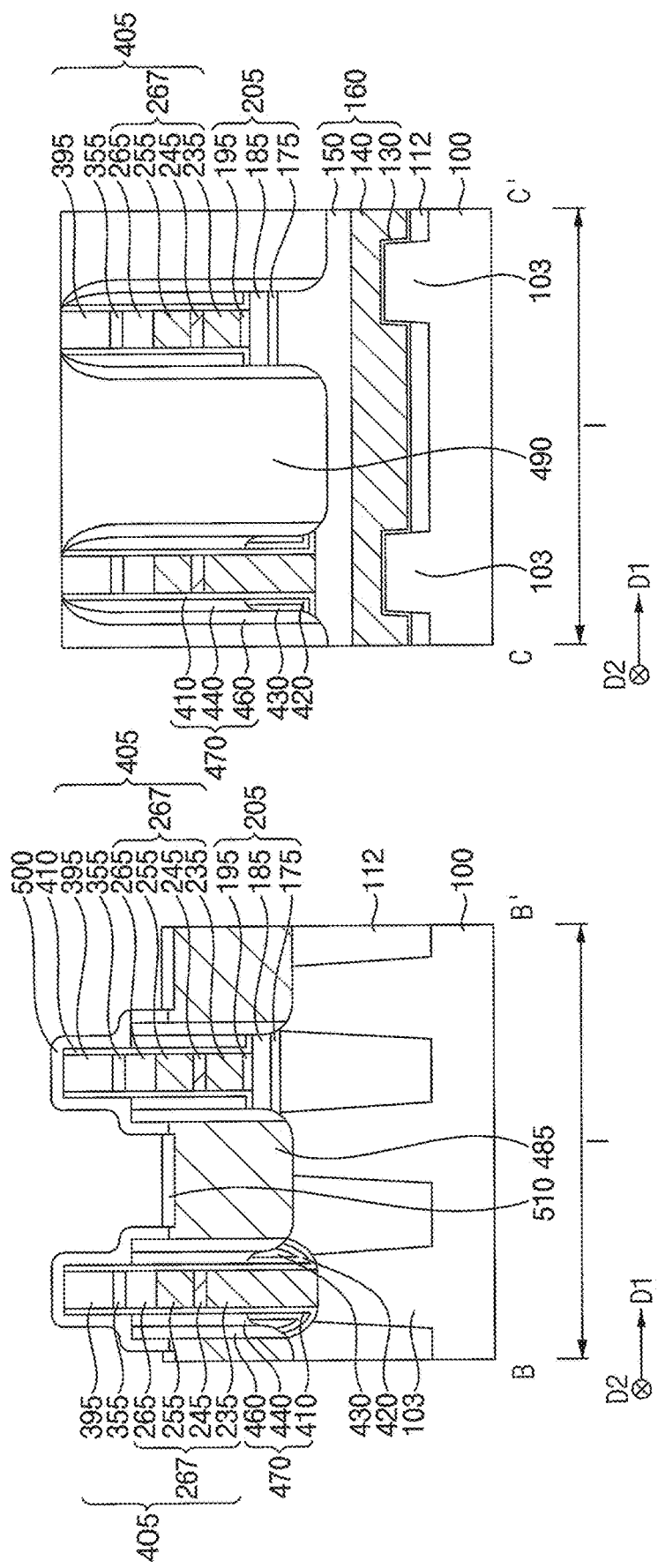

Referring to FIG. 28, an upper portion of the lower contact plug 485 may be removed to expose an upper portion of the preliminary spacer structure 470 on the sidewall of the bit line structure 405, and upper portions of the third and fourth spacers 440 and 460 of the exposed preliminary spacer structure 470 may be removed.

An upper portion of the lower contact plug 485 may be further removed. Thus, the upper surface of the lower contact plug 485 may be lower than uppermost surfaces of the second and third spacers 440 and 460.

A fifth spacer layer may be formed on the bit line structure 405, the preliminary spacer structure 470 and the lower contact plug 485, and may be anisotropically etched so that a fifth spacer 500 may be formed to cover the upper portion of the preliminary spacer structure 470 on each of opposite sidewalls of the bit line structure 405 and the portion of the second capping pattern 395 in contact with the upper surface of the isolation pattern structure 110 in the first direction D1 and that an upper surface of the lower contact plug 485 may be exposed.

A metal silicide pattern 510 may be formed on the exposed upper surface of the lower contact plug 485. According to at least some example embodiments of the inventive concepts, the metal silicide pattern 510 may be formed by forming a first metal layer on the second and fourth capping patterns 395 and 490, the fifth spacer 500 and the lower contact plug 485, thermally treating the first metal layer, and removing an unreacted portion of the first metal layer. The metal silicide pattern 510 may include, e.g., cobalt silicide, nickel silicide, titanium silicide, etc.

Figure 30:
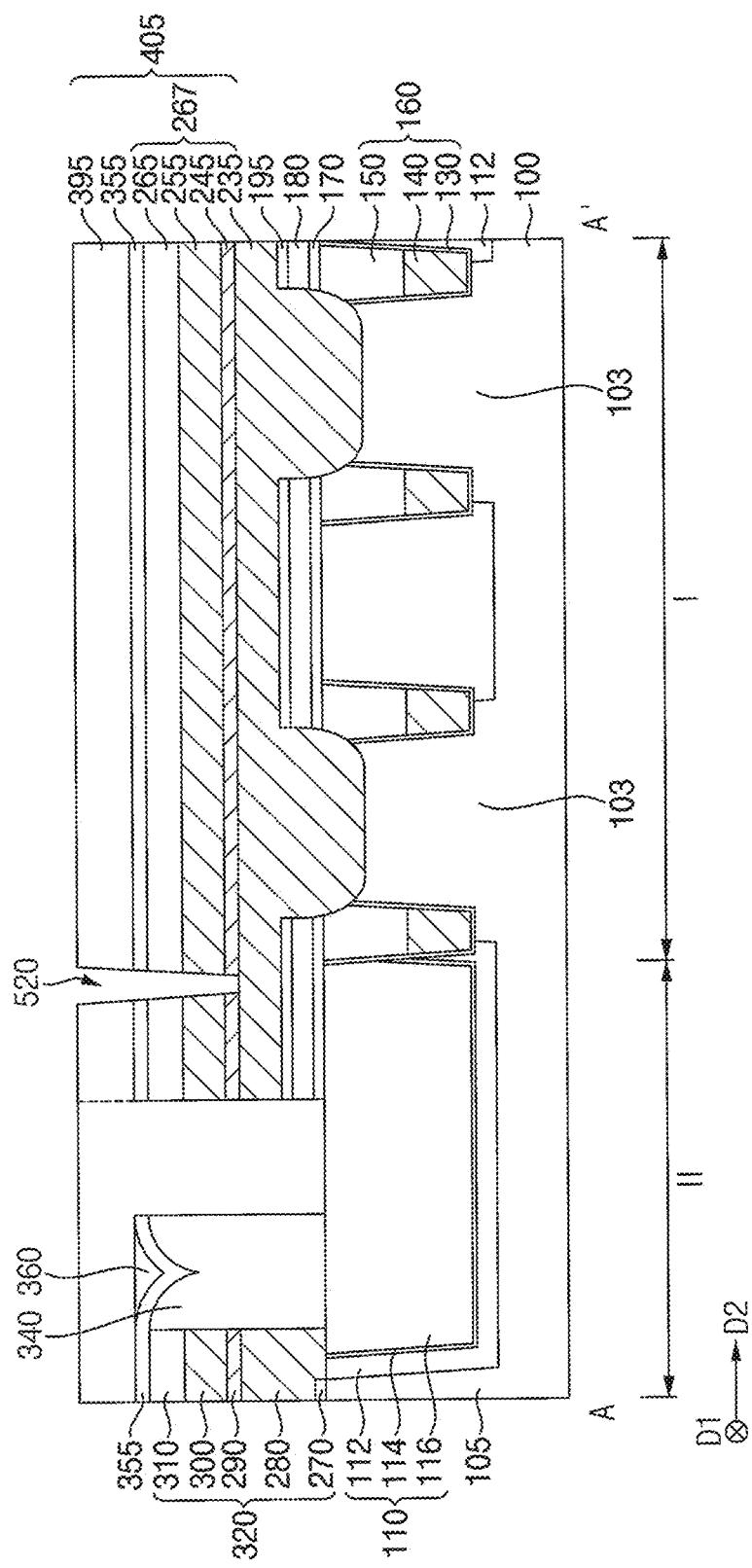

Referring to FIGS. 29 and 30, a first sacrificial layer may be formed on the second and fourth capping patterns 395 and 490, the fifth spacer 500, the metal silicide pattern 510, and the lower contact plug 485, and may be planarized until the upper surfaces of the second and fourth capping patterns 395 and 490 are exposed.

The first sacrificial layer may include, e.g., silicon-on-hardmask (SOH), amorphous carbon layer (ACL), etc.

A seventh opening 520 may be formed partially through a portion of the bit line structure 405 on the second region II of the substrate 100.

In example embodiment, the seventh opening 520 may be formed to an upper surface of the third conductive pattern 235 or an upper surface of the fourth conductive pattern 255.

Figure 31:
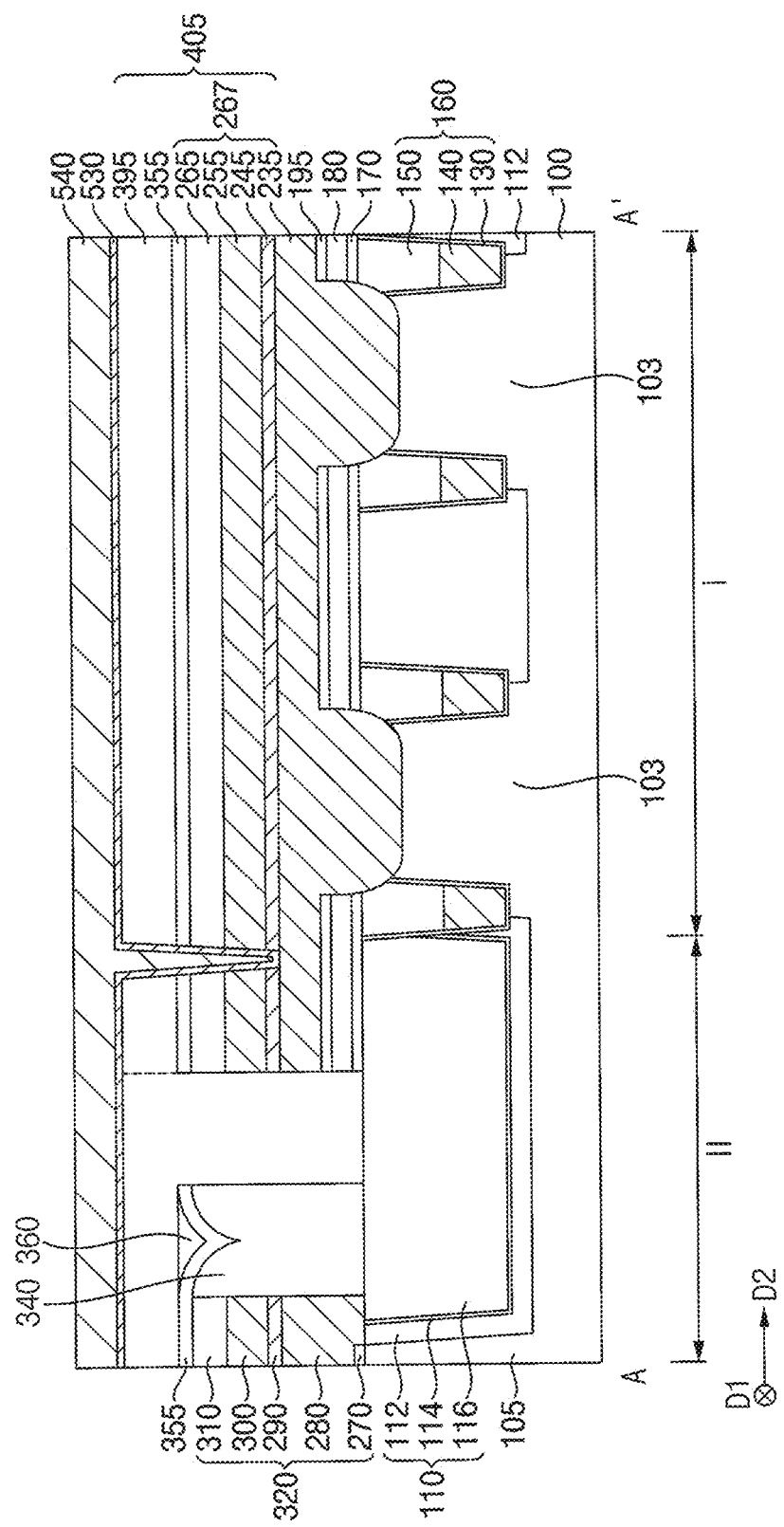
Figure 32:
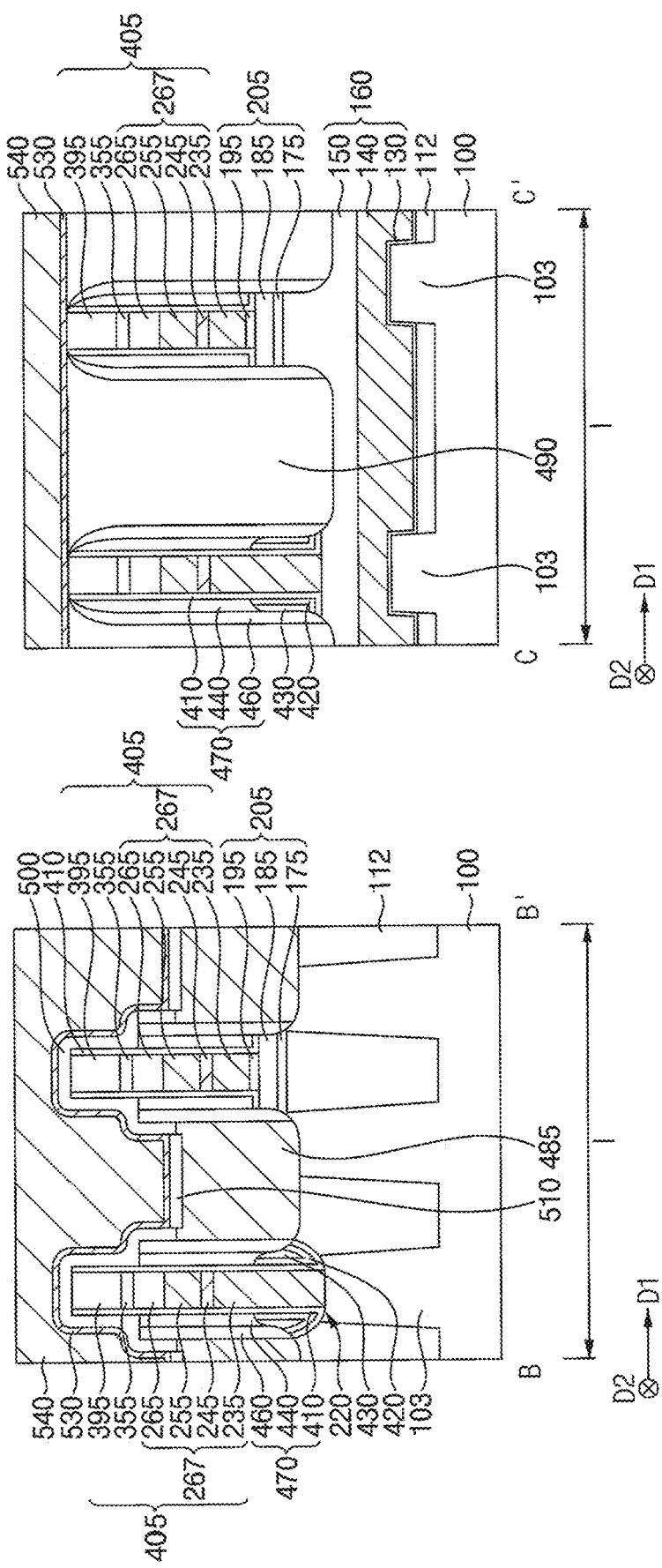
Figure 34:
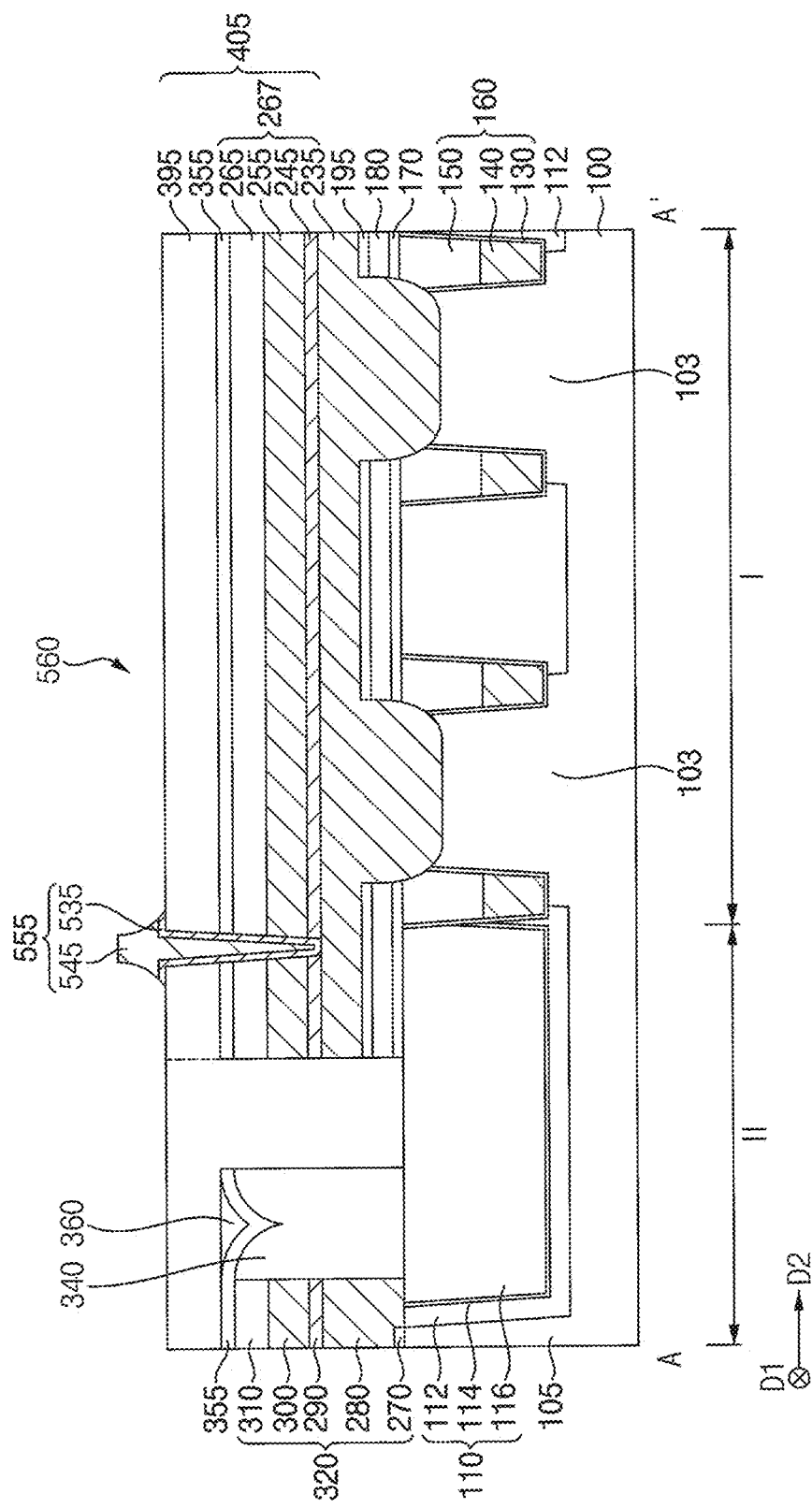
Figure 35:
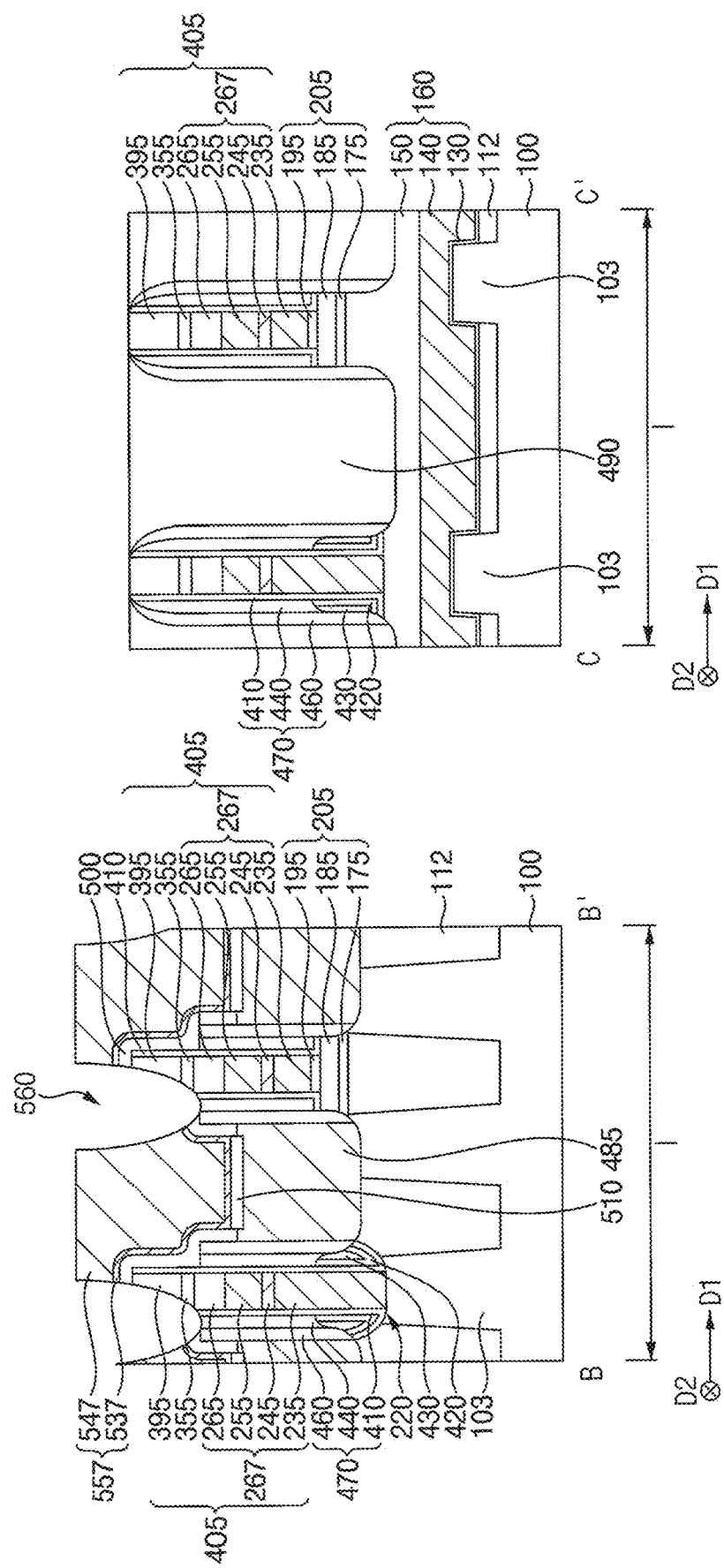
Figure 36:
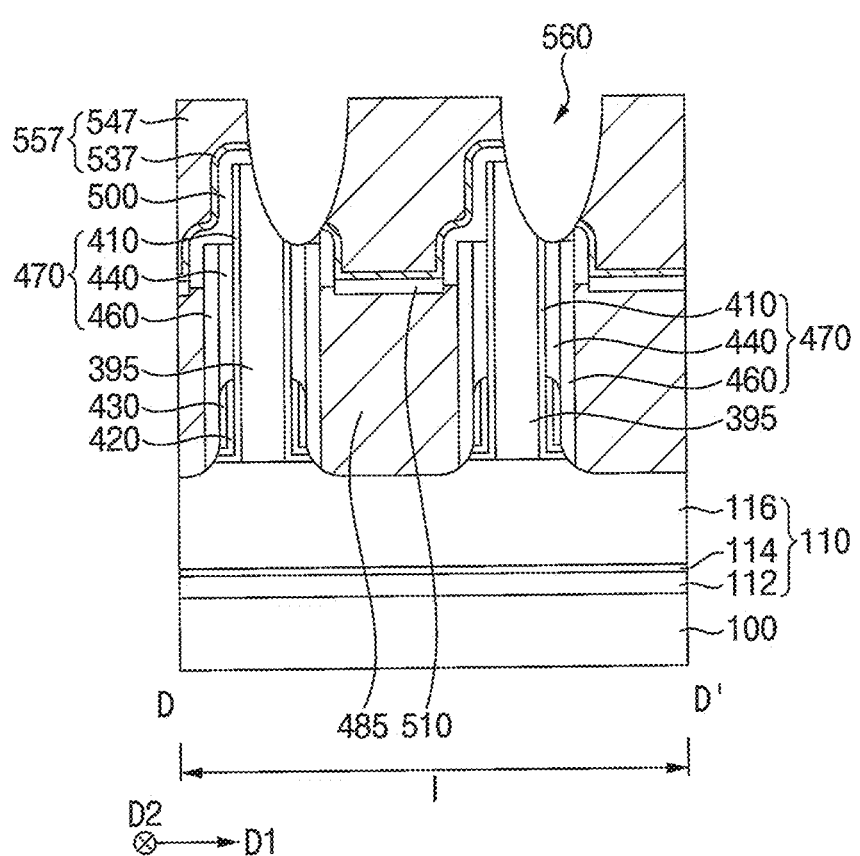

Referring to FIGS. 31 and 32, after removing the first sacrificial layer, a second barrier layer 530 may be formed on the second and fourth capping patterns 395 and 490, the fifth spacer 500, the metal silicide pattern 510, the lower contact plug 485 and a sidewall and a lower surface of the seventh opening 520, and a second metal layer 540 may be formed on the second barrier layer 530 to fill a space between the bit line structures 405, a space between the portions of the second capping patterns 395 in contact with the upper surface of the isolation pattern structure 110 and the seventh opening 520.

A planarization process may be further performed on the second metal layer 540. The planarization process may include a chemical mechanical polishing (CMP) process and/or an etch back process.

Referring to FIGS. 33 to 36, the second metal layer 540 and the second barrier layer 530 may be patterned to form wiring 555, an upper contact plug 557 and a eighth opening 560.

The eighth opening 560 may be formed by partially removing not only the second metal layer 540 and the second barrier layer 530, but also the second to fourth capping patterns 395, 265 and 490, the preliminary spacer structure 470, the fifth spacer 500 and the first etch stop layer 350, and thus may expose an upper surface of the third spacer 440.

As the eighth opening 560 is formed, the second metal layer 540 and the second barrier layer 530 may be transformed into second and third metal patterns 545 and 547 and third and fourth barrier patterns 535 and 537, respectively, covering a lower surface of the second and third metal patterns 545 and 547.

The second metal pattern 545 and the third barrier pattern 535 may together form the wiring 555, and the third metal pattern 547 and the fourth barrier pattern 537 may together form the upper contact plug 557.

According to at least some example embodiments of the inventive concepts, a plurality of upper contact plugs 557 may be spaced apart from each other in one or both of the first and second directions D1 and D2, and may be arranged in a honeycomb pattern in a plan view. Each of the upper contact plugs 557 may have a shape of a circle, ellipse, or polygon in a plan view.

The lower contact plug 485, the metal silicide pattern 510 and the upper contact plug 557 sequentially stacked may together form a contact plug structure.

Figure 37:
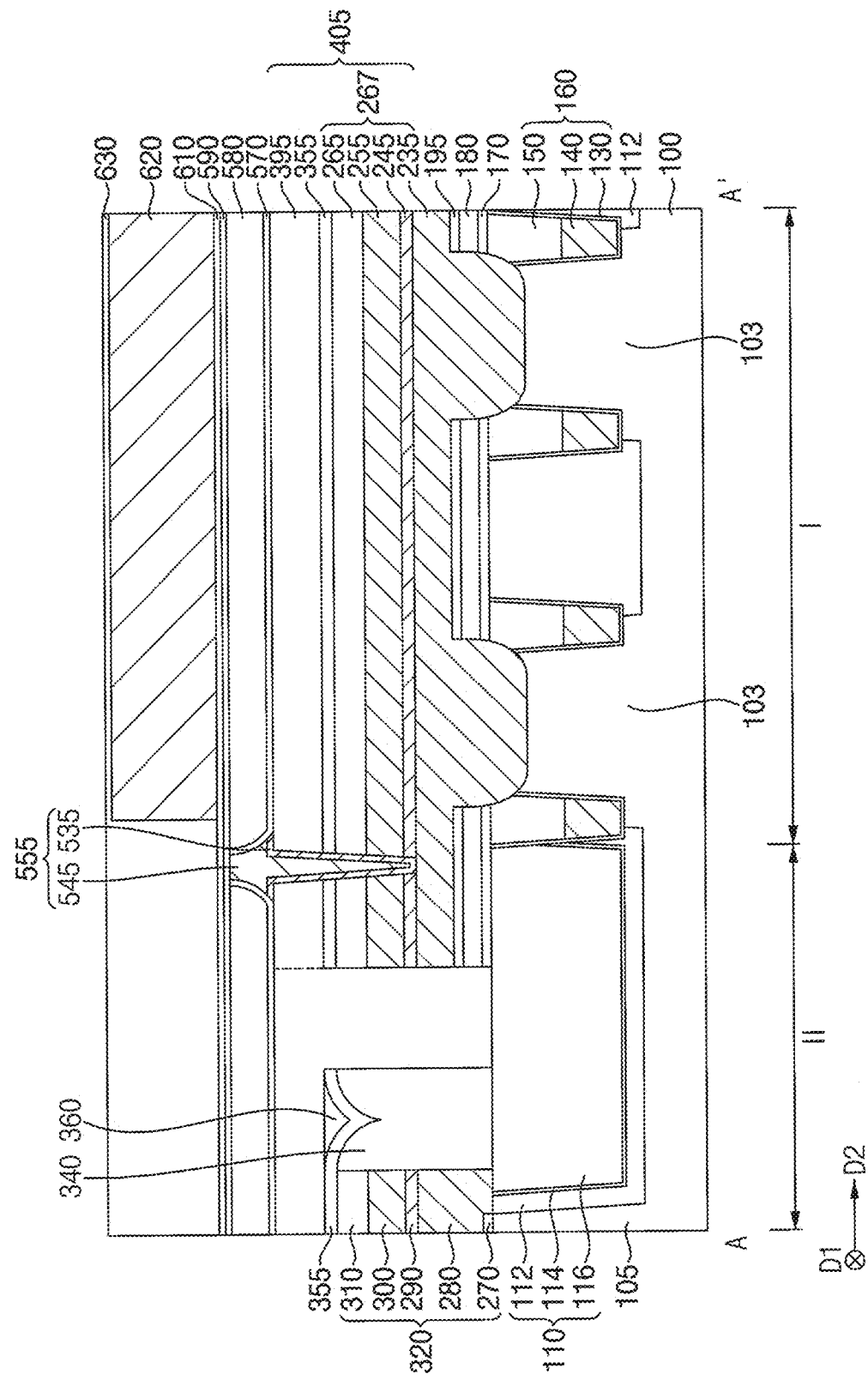
Figure 38:
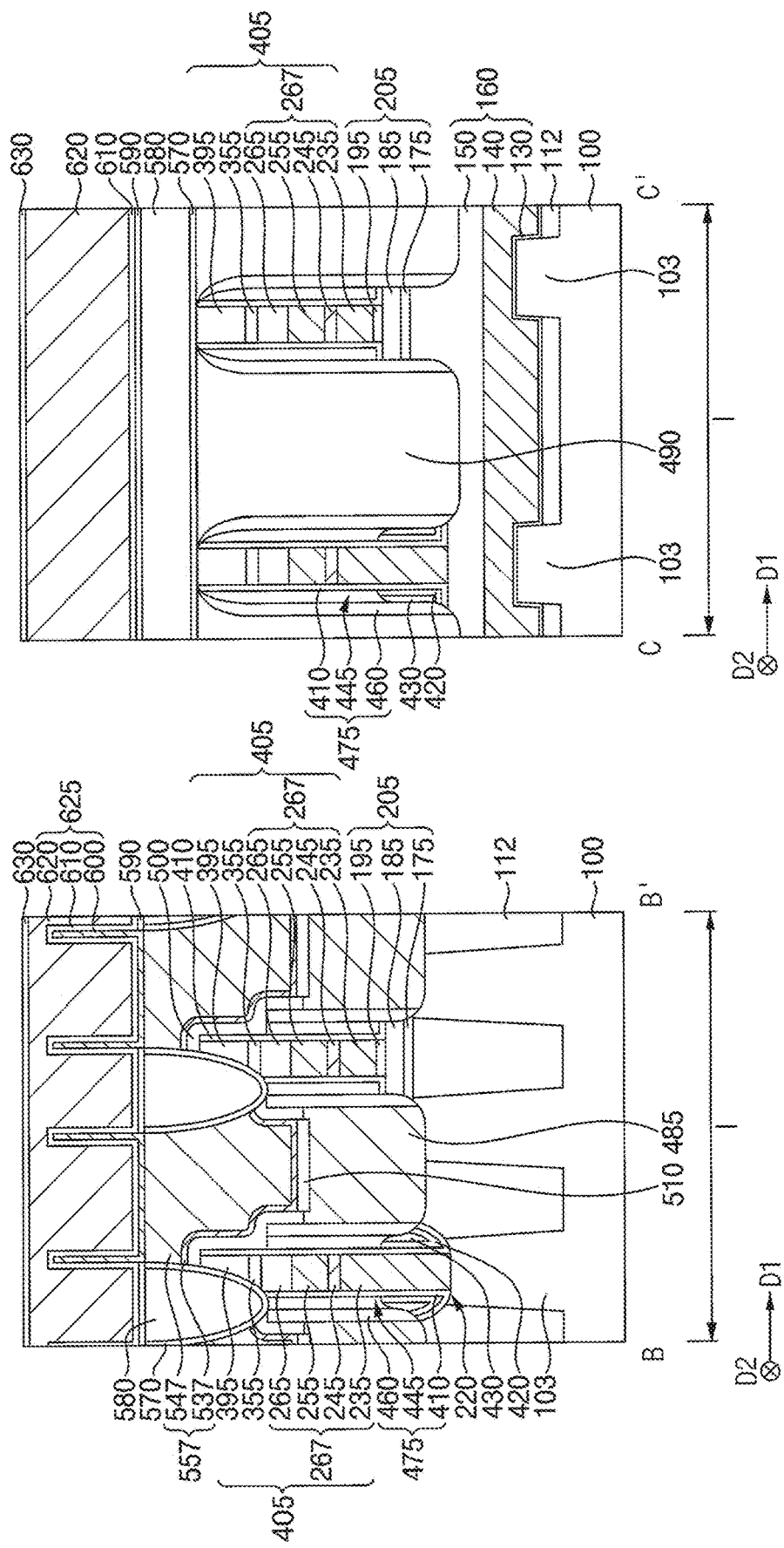
Figure 39:
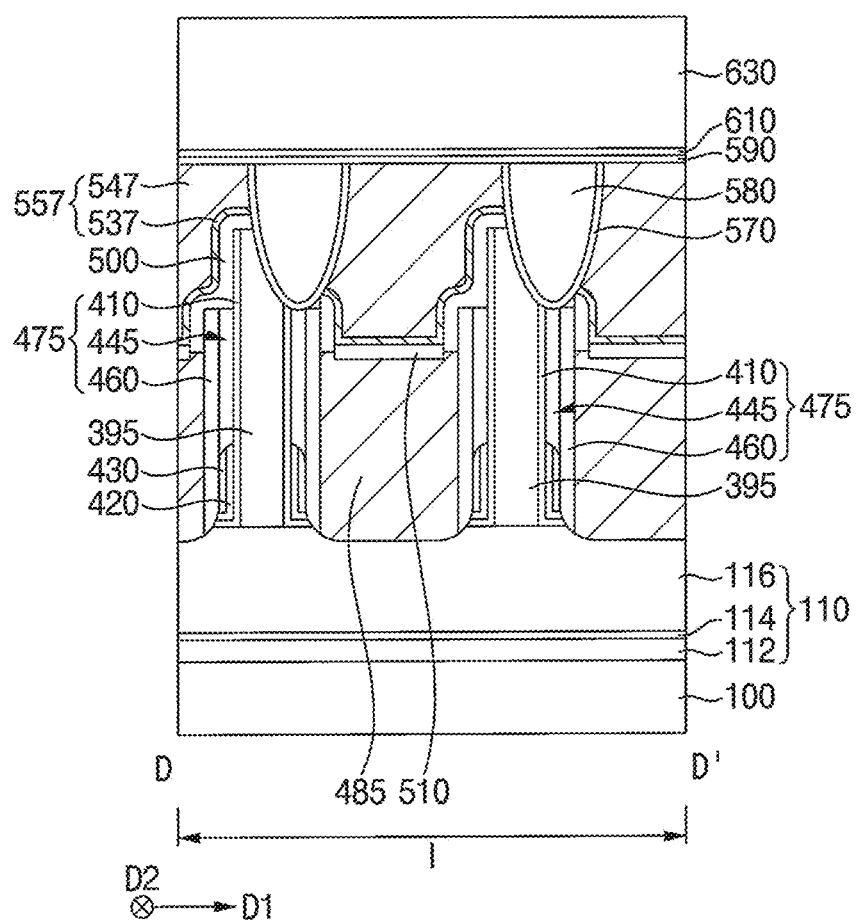

Referring to FIGS. 37 to 39, the exposed third spacer 440 may be removed to form an air gap 445 connected to the sixth opening 547. The third spacer 440 may be removed by, e.g., a wet etching process.

According to at least some example embodiments of the inventive concepts, not only a portion of the third spacer 440 on the sidewall of the bit line structure 405 and the portion of the second capping pattern 395 in contact with the upper surface of the isolation pattern structure 110 extending in the second direction D2 directly exposed by the eighth opening 560 but also other portions of the eighth spacer 560 parallel to the directly exposed portion thereof in the horizontal direction may be removed. That is, not only the portion of the third spacer 440 exposed by the eighth opening 560 not to be covered by the upper contact plug 557 but also a portion of the eighth spacer 560 covered by the upper contact plug 557 may be removed.

A second insulating interlayer may be formed to fill the eighth opening 560.

According to at least some example embodiments of the inventive concepts, the second insulating interlayer may include sixth and seventh insulation layers 570 and 580 sequentially stacked. The sixth insulation layer 570 may include a material having a low gap filling characteristic, and thus the air gap 445 under the eighth opening 560 may not be filled. The air gap 445 may be also referred to as an air spacer 445, and may form a spacer structure 475 together with the second and fourth spacers 410 and 460. That is, the air gap 445 may be a spacer including an air. The seventh insulation layer 580 may include, for example, an oxide, e.g., silicon oxide or a nitride, e.g., silicon nitride.

A capacitor 625 may be formed on an upper surface of the upper contact plug 557.

That is, a second etch stop layer 590 and a mold layer (not shown) may be sequentially formed on the upper contact plug 557, the second insulating interlayer, and the wiring 555, and partially etched to form a ninth opening partially exposing the upper surface of the upper contact plug 557. The second etch stop layer 590 may include, for example, a nitride, e.g., silicon nitride.

A lower electrode layer (not shown) may be formed on a sidewall of the ninth opening, the exposed upper surface of the upper contact plug 557 and the mold layer, a second sacrificial layer (not shown) may be formed on the lower electrode layer to fill the ninth opening, and the lower electrode layer and the second sacrificial layer may be planarized until an upper surface of the mold layer is exposed to divide the lower electrode layer. The second sacrificial layer and the mold layer may be removed by, e.g., a wet etching process, and thus a lower electrode 600 having a cylindrical shape may be formed on the exposed upper surface of the upper contact plug 557. Alternatively, the lower electrode 600 may have a pillar shape filling the ninth opening. The lower electrode 600 may include, for example, a metal, a metal nitride, a metal silicide, doped polysilicon, etc.

A dielectric layer 610 may be formed on a surface of the lower electrode 600 and the second etch stop layer 590, and an upper electrode 620 may be formed on the dielectric layer 610 so that the capacitor 625 including the lower electrode 600, the dielectric layer 610 and the upper electrode 620 may be formed on the first region I of the substrate 100.

The dielectric layer 610 may include, e.g., a metal oxide, and the upper electrode 620 may include, for example, a metal, a metal nitride, a metal silicide, doped polysilicon, etc.

A third insulating interlayer 630 may be formed on the capacitor 625 on the first region I of the substrate 100 and the second etch stop layer 590 on the second region II of the substrate 100 so that the fabrication of the semiconductor device may be completed. The third insulating interlayer 630 may include, for example, an oxide, e.g., silicon oxide.

As described above, the first etch stop layer 350, the first capping layer 260, the second conductive layer 250, the first barrier layer 240 and the first conductive layer 230 may be sequentially etched using the second capping pattern 395 as the etching mask, and the portion of the second capping layer 390 in contact with an upper surface of the isolation pattern structure 110 may also be etched together. That is, the second capping pattern 395 including a nitride may be formed on a sidewall of an end portion in the second direction D2 of the conductive structure 267. The contact plug structures may be formed adjacent to a portion of the second capping pattern 395 on the sidewall of the end portion in the second direction D2 of the conductive structure 267.

If a spacer including an oxide is formed on the sidewall of the end portion in the second direction D2 of the conductive structure 267, the spacer may also be etched together in the etching process, and an etching rate of the spacer may be faster than that of the second conductive layer 250 including a metal. Thus, a width in the first direction D1 of the spacer may be smaller than that of the fourth conductive pattern 255. Accordingly, a sufficient separation distance between the contact plug structures adjacent to the spacer may not be secured, so that an electric short may occur therebetween.

However, in example embodiment, the second capping pattern 295 may include, for example, a nitride, and thus an etching rate of the second capping pattern 295 may be substantially the same as that of the second conductive layer 250. Accordingly, a width in the first direction D1 of the portion of the second capping pattern 395 on the sidewall of the end portion in the second direction D2 of the conductive structure 267 may be substantially the same as that of the conductive structure 267. Thus, a sufficient separation distance between the contact plug structures adjacent to the portion of the second capping pattern 395 on the sidewall of the end portion in the second direction D2 of the conductive structure 267 may be secured, so that an electric short may not occur therebetween.

The semiconductor device manufactured by the above processes may have following structural characteristics.

Referring to FIGS. 33 and 37 to 39, the semiconductor device may include the substrate 100 including the first region I and the second region II surrounding the first region I, the first and second active patterns 103 and 105 on the first region I and the second region II, respectively, of the substrate 100, the first and second gate structures 160 and 320 in or on the substrate 100, the bit line structure 405 extending in the second direction D2 on the first region I and a portion of second region II of the substrate 100, the first etch stop pattern 355, the second capping pattern 395, the first spacer 340, the spacer structure 475, the first insulating interlayer 360, the contact plug structure, the wiring 555, and the capacitor 625. The semiconductor device may further include the fourth capping pattern 490, the insulation pattern structure 205, the fourth and fifth insulation patterns 420 and 430, the second etch stop pattern 590, the second insulating interlayer, and the third insulating interlayer 630.

The spacer 340 may contact a sidewall of the second gate structure 320. According to at least some example embodiments of the inventive concepts, an upper surface of the first spacer 340 may be concave.

The second capping pattern 395 may contact the sidewall of the end portion in the second direction D2 of the conductive structure 267, the sidewall of the first spacer 340 and the upper surface of the isolation pattern structure 110. According to at least some example embodiments of the inventive concepts, a width in the first direction D1 of the second capping pattern 395 may be substantially the same as that of the conductive structure 267.

The second capping pattern 395 may also be formed on the conductive structure 267 and the second gate structure 320. A height of an upper surface of the conductive structure 267 may be substantially the same as that of the second gate structure 320, and thus a height of a portion of the second capping pattern 395 on the conductive structure 267 may be substantially the same as that of a portion of the second capping pattern 395 on the second gate structure 320.

The first etch stop pattern 355 may be formed between the second capping pattern 395 and the third capping pattern 265 of each conductive structure 267 and between the second capping pattern 395 and the first capping pattern 310 of each second gate structure 320. The first etch stop pattern 355 may also be formed between the second capping pattern 395 and the first spacer 340.

The first insulating interlayer 360 may be formed between the second capping pattern 395 and a portion of the first etch stop pattern 355 on the first spacer 340. According to at least some example embodiments of the inventive concepts, a lower surface of the first insulating interlayer 360 may be convex.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A semiconductor device comprising:
   a substrate including a cell region and a peripheral circuit region;
   a conductive structure on the cell region and the peripheral circuit region, the conductive structure extending in a first direction parallel to an upper surface of the substrate;
   a gate structure on the peripheral circuit region, the gate structure spaced apart from the conductive structure in the first direction;
   a spacer contacting a sidewall of the gate structure, wherein an upper surface of the spacer is concave;
   an insulating interlayer on the upper surface of the spacer, wherein a lower surface of the insulating interlayer is convex; and
   a first capping pattern contacting a sidewall of an end portion in the first direction of the conductive structure and a sidewall of the spacer,
   wherein the spacer and the first capping pattern include different insulating materials.

2. The semiconductor device according to claim 1, wherein the first capping pattern includes a nitride, and
   wherein the spacer includes an oxide.

3. The semiconductor device according to claim 1, wherein a width in a second direction of the first capping pattern is substantially the same as that of the conductive structure, the second direction being a direction parallel to the upper surface of the substrate and crossing the first direction.

4. The semiconductor device according to claim 1, wherein the first capping pattern is formed on the conductive structure and the gate structure.

5. The semiconductor device according to claim 4, wherein the conductive structure includes a first conductive pattern, a first barrier pattern and a second conductive pattern sequentially stacked in a vertical direction perpendicular to the upper surface of the substrate, wherein the gate structure includes a third conductive pattern, a second barrier pattern and a fourth conductive pattern sequentially stacked in the vertical direction, and
   wherein a height of an upper surface of a portion of the first capping pattern on the conductive structure is substantially the same as that of an upper surface of a portion of the first capping pattern on the gate structure.

6. The semiconductor device according to claim 5, wherein the conductive structure further includes a second capping pattern on the second conductive pattern,
   wherein the gate structure further includes a third capping pattern on the fourth conductive pattern, and
   wherein the first capping pattern is formed on the second and third capping patterns.

7. The semiconductor device according to claim 6, further comprising:
   an etch stop pattern between the first and second capping patterns and between the first and third capping patterns.

8. The semiconductor device according to claim 7, wherein the etch stop pattern is formed between the first capping pattern and the spacer.

9. The semiconductor device according to claim 8, wherein the insulating interlayer is between the first capping pattern and a portion of the etch stop pattern on the spacer.

10. The semiconductor device according to claim 1, further comprising:
    a first active pattern on the cell region of the substrate;
    a second active pattern on the peripheral circuit region of the substrate; and
    an isolation pattern structure on the substrate, the isolation pattern structure between the first and second active patterns,
    wherein the first capping pattern contacts an upper surface of the isolation pattern structure.

11. A semiconductor device comprising:
    a substrate including a cell region and a peripheral circuit region;
    a conductive structure on the cell region and the peripheral circuit region, the conductive structure extending in a first direction parallel to an upper surface of the substrate;
    a gate structure on the peripheral circuit region, the gate structure spaced apart from the conductive structure in the first direction;
    a spacer contacting a sidewall of the gate structure;
    an insulating interlayer on an upper surface of the spacer; and
    a first capping pattern contacting a sidewall of an end portion in the first direction of the conductive structure and a sidewall of the spacer,
    wherein an upper surface of the spacer is concave, and a lower surface of the insulating interlayer is convex.

12. The semiconductor device according to claim 11, wherein the spacer includes an oxide, and
    wherein the first capping pattern includes a nitride.

13. The semiconductor device according to claim 11, wherein the conductive structure includes a first conductive pattern, a first barrier pattern and a second conductive pattern sequentially stacked in a vertical direction perpendicular to the upper surface of the substrate,
    wherein the gate structure includes a third conductive pattern, a second barrier pattern and a fourth conductive pattern sequentially stacked in the vertical direction.

14. The semiconductor device according to claim 13, wherein the conductive structure further includes a second capping pattern on the second conductive pattern,
wherein the gate structure further includes a third capping pattern on the fourth conductive pattern, and
wherein the first capping pattern is formed on the second and third capping patterns.

15. The semiconductor device according to claim 14, further comprising:
an etch stop pattern between the first and second capping patterns, between the first and third capping patterns and between the first capping pattern and the spacer.

16. The semiconductor device according to claim 15, wherein the insulating interlayer is between the first capping pattern and a portion of the etch stop pattern on the spacer.

17. A semiconductor device comprising:
a substrate including a cell region and a peripheral circuit region;
a first active pattern on the cell region of the substrate;
a second active pattern on the peripheral circuit region of the substrate;
an isolation pattern structure on the substrate, the isolation pattern structure between the first and second active patterns,
a first gate structure in an upper portion of the first active pattern, the first gate structure extending in a first direction parallel to an upper surface of the substrate;
a second gate structure on the second active pattern and a portion of the isolation pattern structure, the second gate structure including a first conductive pattern, a first barrier pattern, a second conductive pattern and a first capping pattern sequentially stacked in a vertical direction perpendicular to the upper surface of the substrate;
a spacer contacting a sidewall of the second gate structure, wherein an upper surface of the spacer is concave;
an insulating interlayer on the upper surface of the spacer, wherein a lower surface of the insulating interlayer is convex;
a conductive structure on the first active pattern and a portion of the isolation pattern structure,
the conductive structure extending in a second direction, the second direction being a direction that is parallel to the upper surface of the substrate and crosses the first direction,
the conductive structure including a third conductive pattern, a second barrier pattern, a fourth conductive pattern and a second capping pattern sequentially stacked in the vertical direction;
an etch stop pattern on an upper surface of the conductive structure, an upper surface of the second gate structure and an upper surface of the spacer;
a third capping pattern on the etch stop pattern, the third capping pattern contacting a sidewall of an end portion, in the second direction, of the conductive structure and a sidewall of the spacer;
a contact plug structure on the first active pattern and adjacent to the conductive structure; and
a capacitor on the contact plug structure,
wherein the spacer and the third capping pattern include different insulating materials.

18. The semiconductor device according to claim 17, wherein the spacer includes an oxide, and
wherein the third capping pattern includes a nitride.

19. The semiconductor device according to claim 17, further comprising:
an insulating interlayer between the third capping pattern and the spacer, the insulating interlayer including an oxide.

20. The semiconductor device according to claim 17, wherein a height of an upper surface of the conductive structure is substantially the same as that of the second gate structure, such that a height of an upper surface of a portion of the third capping pattern on the conductive structure is substantially the same as that of an upper surface of a portion of the third capping pattern on the second gate structure.

* * * * *